(12) United States Patent
Kim et al.

(10) Patent No.: US 11,910,677 B2
(45) Date of Patent: Feb. 20, 2024

(54) DISPLAY DEVICE

(71) Applicant: Samsung Display Co., Ltd., Yongin-Si (KR)

(72) Inventors: Tae Hoon Kim, Cheonan-si (KR); Won Kyu Kwak, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/891,910

(22) Filed: Aug. 19, 2022

(65) Prior Publication Data

US 2022/0392994 A1 Dec. 8, 2022

Related U.S. Application Data

(63) Continuation of application No. 17/002,705, filed on Aug. 25, 2020, now Pat. No. 11,424,313.

(30) Foreign Application Priority Data

Sep. 18, 2019 (KR) .................... 10-2019-0114735

(51) Int. Cl.
*H10K 59/131* (2023.01)
*G09G 3/3258* (2016.01)
*G09G 3/3291* (2016.01)
*G09G 3/3266* (2016.01)

(52) U.S. Cl.
CPC ......... *H10K 59/131* (2023.02); *G09G 3/3258* (2013.01); *G09G 3/3266* (2013.01); *G09G 3/3291* (2013.01)

(58) Field of Classification Search
CPC .. G09G 3/3258; G09G 3/3266; G09G 3/3291; H01L 27/3276; H10K 59/131
See application file for complete search history.

(56) References Cited

U.S. PATENT DOCUMENTS 10,763,323 B2    9/2020   Moy et al.

FOREIGN PATENT DOCUMENTS

| KR | 10-2008-0090954 A | 10/2008 |
|---|---|---|
| KR | 10-2017-0068796 A | 6/2017 |
| KR | 10-2018-0049005 A | 5/2018 |

*Primary Examiner* — Sardis F Azongha
(74) *Attorney, Agent, or Firm* — Innovation Counsel LLP

(57) ABSTRACT

A display device may include a substrate, pixels, a first common voltage line, an outer common voltage trunk line, a first outer common voltage line, and a second outer common voltage line. The substrate may include a display area and a non-display area. The pixels may be disposed on the display area. The first common voltage line may be at least partially disposed on the display area. The outer common voltage trunk line may be disposed on the non-display area, may be electrically connected through the first common voltage line to the pixels, and may include a groove. The first outer common voltage line may protrude from the outer common voltage trunk line. The second outer common voltage line may protrude from the outer common voltage trunk line. The groove may be disposed between the second outer common voltage line and the first common voltage line.

31 Claims, 23 Drawing Sheets

DISPLAY DEVICE

CROSS-REFERENCE TO RELATED APPLICATIONS

This application is a continuation application of U.S. patent application Ser. No. 17/002,705, which was filed on Aug. 25, 2020 and claims priority to Korean Patent Application No. 10-2019-0114735 filed in the Korean Intellectual Property Office on Sep. 18, 2019; the related applications are incorporated by reference.

BACKGROUND

(a) Technical Field

The technical field relates to a display device.

(b) Description of the Related Art

Display devices may display images. Modern display devices may include light emitting diode display devices.

A light emitting diode display device does not require a separate light source and thus can have minimized thickness and weight. Advantages of the light emitting diode display may further include low power consumption, high luminance, and/or a high reaction speed.

Generally, the light emitting diode display includes a substrate, thin film transistors disposed on the substrate, insulating layers disposed between wires connected to the thin film transistors, and light emitting elements respectively connected to the thin film transistors. The light emitting elements may be, for example, organic light emitting elements.

The display device may include a display area and a non-display area. As the non-display area is minimized, a density of current flows in the non-display area may be significantly high. As a result, much heat may be generated in the non-display area.

The Background section is for understanding of the background of embodiments. The Background section may contain information that does not form the prior art that is already known in this country to a person of ordinary skill in the art.

SUMMARY

Embodiments may be related a display device in which undesirable heating of wiring in a non-display area is prevented or mitigated.

A display device according to an embodiment includes the following elements: a substrate including a display area and a non-display area; an outer common voltage line disposed in the non-display area; and first common voltage lines connected to a plurality of pixels disposed in the display area and one end of the outer common voltage line, wherein the other end of the outer common voltage line is branched into a first outer common voltage line and a second outer common voltage line, and includes a groove disposed between the second outer common voltage line and the first common voltage line.

The first outer common voltage line, the second outer common voltage line, and the first common voltage lines may be disposed in parallel to a second direction, and the groove may be disposed in parallel to a first direction perpendicular to the second direction.

Among the first common voltage lines, the number of first common voltage lines connected to the first outer common voltage line may be larger than the number of first common voltage lines connected to the second outer common voltage line.

An outer initialization voltage line disposed between the outer common voltage line and the display area and disposed in parallel to the second direction may be further included.

The outer common voltage line may include a first end and a second end facing each other, the first end and the second end may be disposed on the same side of the display area, an outer driving voltage line disposed between the first end and the second end may be further included, and the outer driving voltage line and each pixel disposed in the display area may be connected by a driving voltage line.

The outer common voltage line may be disposed to surround the four sides of the display area.

A portion of pixels among the plurality of pixels may overlap the first common voltage line, and a portion of pixels connected to the first common voltage line may not overlap the driving voltage line.

A second common voltage line connected to the first common voltage line and crossing the first common voltage line may be further included.

The first common voltage line may be disposed between the plurality of pixels, and may be disposed in parallel to the driving voltage line connected to each of the plurality of pixels.

A second common voltage line connected to the first common voltage line and crossing the first common voltage line may be further included.

At least one outer common sub-voltage line among the outer common voltage line may be disposed in parallel to one side of the display area, and another outer common sub-voltage line among the outer common voltage line may be disposed in parallel to the other side facing one side.

The portion of pixels among the plurality of pixels may overlap the first common voltage line, and the portion of pixels overlapping the first common voltage line may do not overlap the driving voltage line.

A second common voltage line connected to the first common voltage line and crossing the first common voltage line may be further included.

The first common voltage line may be disposed between the plurality of pixels and disposed in parallel to the driving voltage line connected to each of the plurality of pixels.

A second common voltage line connected to the first common voltage line and crossing the first common voltage line may be further included.

A display device according to another embodiment includes: a substrate including a display area and a non-display area; an outer common voltage line disposed in the non-display area; and first common voltage lines connected to the plurality of pixels disposed in the display area and one end of the outer common voltage line, wherein the outer common voltage line includes a first outer common voltage line and a second outer common voltage line divided via an opening interposed therebetween.

The first outer common voltage line, the second outer common voltage line, and the first common voltage lines may be disposed in parallel to a second direction, and the opening may be disposed in parallel to the second direction.

The opening may further include a region parallel to a first direction perpendicular to the second direction.

Among the first common voltage lines, the number of first common voltage lines connected to the first outer common voltage line may be larger than the number of first common voltage lines connected to the second outer common voltage line.

An outer initialization voltage line disposed between the outer common voltage line and the display area and parallel to the second direction may be further included.

The outer common voltage line may include a first end and a second end facing each other, the first end and the second end may be disposed on the same side of the display area, an outer driving voltage line may be disposed between the first end and the second end, and the outer driving voltage line and each pixel disposed in the display area may be connected by a driving voltage line.

The outer common voltage line may be disposed to surround four sides of the display area.

The portion of pixels among the plurality of pixels may overlap the first common voltage line, and the portion of pixels overlapping the first common voltage line may not overlap the driving voltage line.

A second common voltage line connected to the first common voltage line and crossing the first common voltage line may be further included.

The first common voltage line may be disposed between the plurality of pixels and parallel to a driving voltage line connected to each of the plurality of pixels.

A second common voltage line connected to the first common voltage line and crossing the first common voltage line may be further included.

At least one outer common sub-voltage line of the outer common voltage line may be disposed in parallel to one side of the display area, and another outer common sub-voltage line of the outer common voltage line may be disposed in parallel to the other side facing the one side.

The portion of pixels of the plurality of pixels may overlap the first common voltage line, and the portion of pixels overlapping the first common voltage line may not overlap the driving voltage line.

A second common voltage line connected to the first common voltage line and crossing the first common voltage line may be further included.

The first common voltage line may be disposed between the plurality of pixels and parallel to a driving voltage line connected to each of the plurality of pixels.

A second common voltage line connected to the first common voltage line and crossing the first common voltage line may be further included.

An embodiment may be related to a display device. The display device may include a substrate, pixels, a first common voltage line, an outer common voltage trunk line, a first outer common voltage line, and a second outer common voltage line. The substrate may include a display area and a non-display area. The pixels may be disposed on the display area. The first common voltage line may be at least partially disposed on the display area. The outer common voltage trunk line may be disposed on the non-display area, may be electrically connected through the first common voltage line to the pixels, and may include a groove. The first outer common voltage line may protrude from the outer common voltage trunk line. The second outer common voltage line may protrude from the outer common voltage trunk line. The groove may be disposed between the second outer common voltage line and the first common voltage line.

A lengthwise direction of the second outer common voltage line may be perpendicular to a lengthwise direction of the groove.

The shortest electrical path between the first common voltage line and the first outer common voltage line is shorter than the shortest electrical path between the first common voltage line and the second outer common voltage line.

The display device may include an outer initialization voltage line disposed between the outer common voltage trunk line and the display area and electrically connected to at least some of the pixels.

The display device may include the following elements: a driving voltage line at least partially disposed on the display area; and an outer driving voltage trunk line disposed on the non-display area, disposed between a first end of the outer common voltage trunk line and a second end of the outer common voltage trunk line, electrically insulated from the outer common voltage trunk line, and electrically connected to at least some of the pixels through the driving voltage line.

The outer common voltage trunk line may include a first section, a second section, a third section, a fourth section, and a fifth section. The first section may be opposite the second section in a first direction. The third section may be opposite each of the fourth section and the fifth section in a second direction different from the first direction. The display area may be disposed between the first section and the second section in the first direction. The display area may be disposed between the third section and each of the fourth section and the fifth section in the second direction.

Some of the pixels overlap the first common voltage line and do not overlap the driving voltage line.

The display device may include a second common voltage line electrically connected to the first common voltage line and crossing the first common voltage line.

The first common voltage line may be disposed between a first subset of the pixels and a second subset of the pixels. A lengthwise direction of the first common voltage line may be parallel to a lengthwise direction of the driving voltage line.

The display device may include a second common voltage line electrically connected to the first common voltage line and crossing the first common voltage line.

The outer common voltage trunk line may include a first section and a second section. The second section may be opposite the first section. Two opposite sides of the display area may be disposed between the first section of the outer common voltage trunk line and the second section of the outer common voltage trunk line.

Some of the pixels overlap the first common voltage line and do not overlap the driving voltage line.

The display device may include a second common voltage line electrically connected to the first common voltage line and crossing the first common voltage line.

The first common voltage line may be disposed between a first subset of the pixels and a second subset of the pixels. A lengthwise direction of the first common voltage line may be parallel to a lengthwise direction of the driving voltage line.

The display device may include a second common voltage line electrically connected to the first common voltage line and crossing the first common voltage line.

An embodiment may be related to a display device. The display device may include the following elements: a substrate including a display area and a non-display area; pixels disposed on the display area; a first common voltage line at least partially disposed on the display area; a first outer common voltage trunk line configured to transmit a common voltage, disposed on the non-display area, and electrically connected through the first common voltage line to at least a first subset of the pixels; a second outer common voltage trunk line spaced from the first outer common voltage trunk line in at least a first direction, configured to transmit the common voltage, and disposed on the non-display area; a first outer common voltage line protruding from the first outer common voltage trunk line in a second direction and disposed on the non-display area, wherein the second direction may be different from the first direction; and a second outer common voltage line protruding from the second outer common voltage trunk line and disposed on the non-display area.

Each of a lengthwise direction of the first outer common voltage line, a lengthwise direction of the second outer common voltage line, and a lengthwise direction of the first common voltage lines may be perpendicular to the first direction.

A first side of the first outer common voltage trunk line may be opposite a first side of the second outer common voltage trunk line in the first direction. A second side of the first outer common voltage trunk line may be opposite a second side of the second outer common voltage trunk line in the second direction.

The total number of common voltage lines directly connected to the first outer common voltage trunk line may be larger than the total number of common voltage lines directly connected to the second outer common voltage trunk line.

The display device may include an outer initialization voltage line disposed between the second outer common voltage trunk line and the display area and electrically connected to at least some of the pixels.

The display device may include the following elements: a third outer common voltage trunk line spaced from the first outer common voltage trunk line in the first direction, wherein the first outer common voltage trunk line may be disposed between the second outer common voltage trunk line and the third outer common voltage trunk line; a driving voltage line at least partially disposed on the display area; and an outer driving voltage trunk line disposed on the non-display area, disposed between the first outer common voltage trunk line and the third outer common voltage trunk line, electrically insulated from each of the first outer common voltage trunk line and the third outer common voltage trunk line, and electrically connected to at least some of the pixels through the driving voltage line.

The display area may be disposed between a first section of the second outer common voltage trunk line and a second section of the second outer common voltage trunk line.

Some of the pixels overlap the first common voltage line and do not overlap the driving voltage line.

The display device may include a second common voltage line electrically connected to the first common voltage line and crossing the first common voltage line.

The first common voltage line may be disposed between a first subset of the pixels and a second subset of the pixels. A lengthwise direction of the first common voltage line may be parallel to a lengthwise direction of the driving voltage line.

The display device may include a second common voltage line electrically connected to the first common voltage line and crossing the first common voltage line.

At least one edge of the first outer common voltage line may be parallel to one side of the display area and may be disposed between an edge of the second outer common voltage trunk line and the one side of the display area in the second direction.

Some of the pixels overlap the first common voltage line and do not overlap the driving voltage line.

The display device may include a second common voltage line electrically connected to the first common voltage line and crossing the first common voltage line.

The first common voltage line may be disposed between a first subset of the pixels and a second subset of the pixels. A lengthwise direction of the first common voltage line may be parallel to a lengthwise direction of the driving voltage line.

The display device may include a second common voltage line electrically connected to the first common voltage line and crossing the first common voltage line.

According to embodiments, in a display device, heat generated in wires disposed in the non-display area may be minimized and/or effectively dissipated.

DETAILED DESCRIPTION OF EMBODIMENTS

Figure 1:
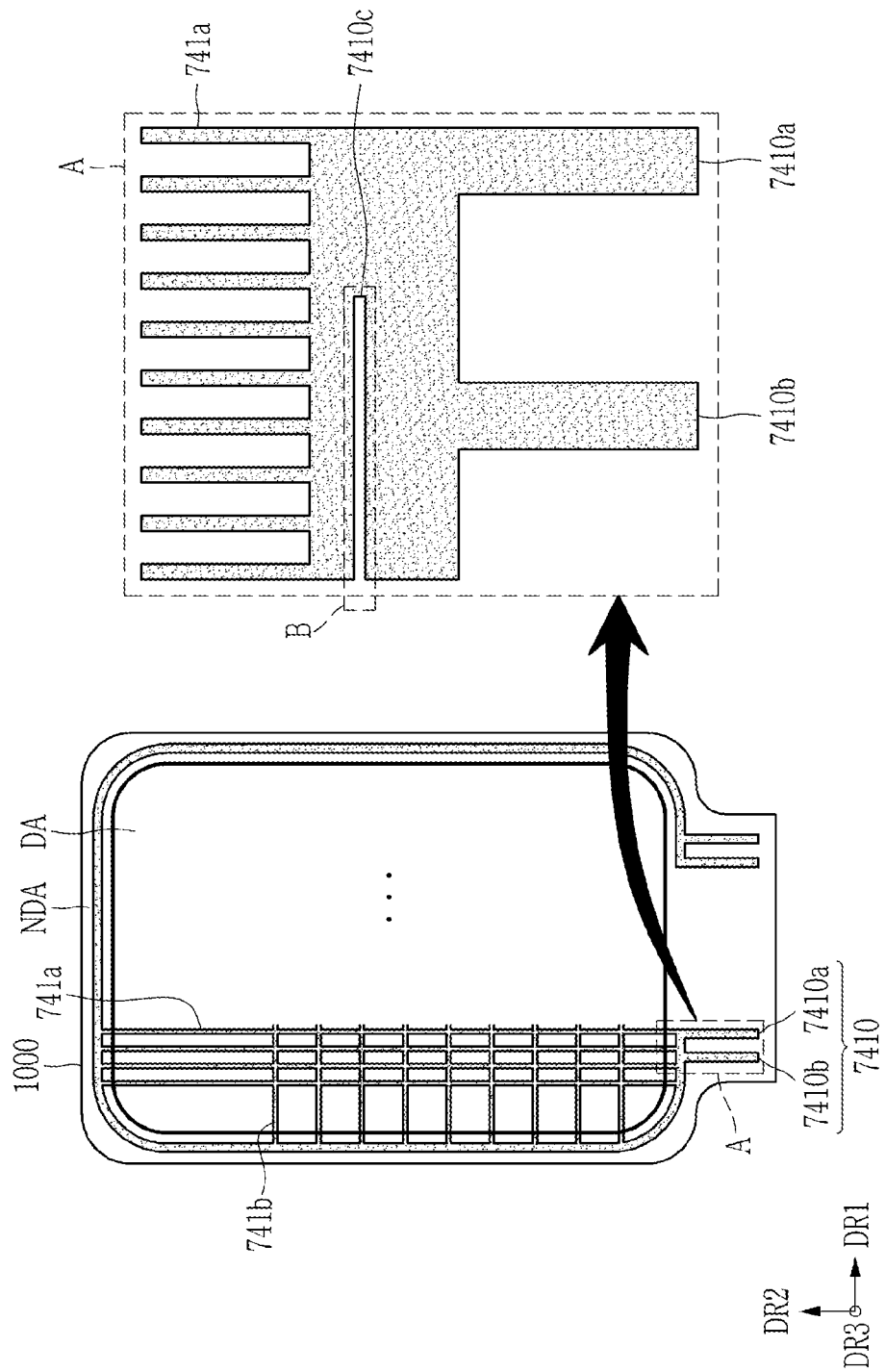
FIG. 1 is a view (e.g., a plan view) showing a display device according to an embodiment.

Embodiments are described with reference to the accompanying drawings. The described embodiments may be modified in various ways.

Same elements or analogous elements may be designated by same reference numerals.

In the drawings, dimensions may be exaggerated for clarity.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set), " "second-type (or second-set)," etc., respectively.

When a first element is referred to as being "on" a second element, the first element can be directly on the second element, or one or more intervening elements may be present between the first element and the second element. When a first element is referred to as being "directly on" a second element, there are no intervening elements (except environmental elements such as air) present between the first element and the second element.

Unless explicitly described to the contrary, the word "comprise" and variations such as "comprises" or "comprising" may imply the inclusion of stated elements but not the exclusion of any other elements.

The term "outer common voltage line" may mean "outer common voltage trunk line." The term "connect" may mean "electrically connect." The term "insulate" may mean "electrically insulate" or "electrically isolate." The term "groove" may mean "opening" or "hole." The term "opening" may mean "gap." The term "the same as" may mean "substantially the same as," "substantially identical to," or "analogous to."

FIG. 1 is a view showing a display device 1000 according to an embodiment. Referring to FIG. 1, the display device 1000 includes a display area DA and a non-display area NDA. A substrate (e.g., the substrate 110 shown in FIG. 22) of the display device 1000 may include a display area and a non-display area that respectively correspond to the display area DA and the non-display area NDA.

Referring to FIG. 1, an outer common voltage line 7410 may substantially surround the display area DA. The outer common voltage line 7410 is connected to a first common voltage line 741*a* and a second common voltage line 741*b* disposed in the display area DA. The outer common voltage line 7410 applies a common voltage ELVSS (shown in FIG. 20) in the display area DA.

In FIG. 1, only some first common voltage lines 741*a* and some second common voltage lines 741*b* are illustrated for convenience of description, but first common voltage lines 741*a* and second common voltage lines 741*b* may form a mesh throughout the display area DA. In embodiments, first common voltage lines 741*a* or second common voltage lines 741*b*, but not both, may be disposed in the display area DA.

Each first common voltage line 741*a* may be lengthwise in the second direction DR2, and each second common voltage line 741*b* may be lengthwise in the first direction DR1.

In FIG. 1, the portion labeled by A is enlarged and shown separately for clarity. Referring to FIG. 1, on one edge of the display device 1000, the outer common voltage line 7410 is directly connected to a first outer common voltage line 7410*a* and a second outer common voltage line 7410*b*. As shown in FIG. 1, on one edge connected to a pad part of the display device 1000, the outer common voltage line 7410 may be directly connected to the first outer common voltage line 7410*a* and the second outer common voltage line 7410*b*.

Referring to the portion B of FIG. 1, the outer common voltage line 7410 includes a groove 7410*c*. Referring to FIG. 1, the groove 7410*c* may be lengthwise in a direction parallel to the second common voltage line 741*b*, that is, in the first direction DR1.

The groove 7410*c* is disposed between a plurality of first common voltage line 741*a* and the second outer common voltage line 7410*b*, so that an electrical path is lengthened between the plurality of first common voltage lines 741*a* and the second outer common voltage line 7410*b*.

Therefore, a potential problem of heat generation due to an excessive current simultaneously flowing to the second common voltage line 7410*b* may be prevented or mitigated. Advantageously, satisfactory reliability and/or durability of the display device 1000 may be attained.

Figure 2:
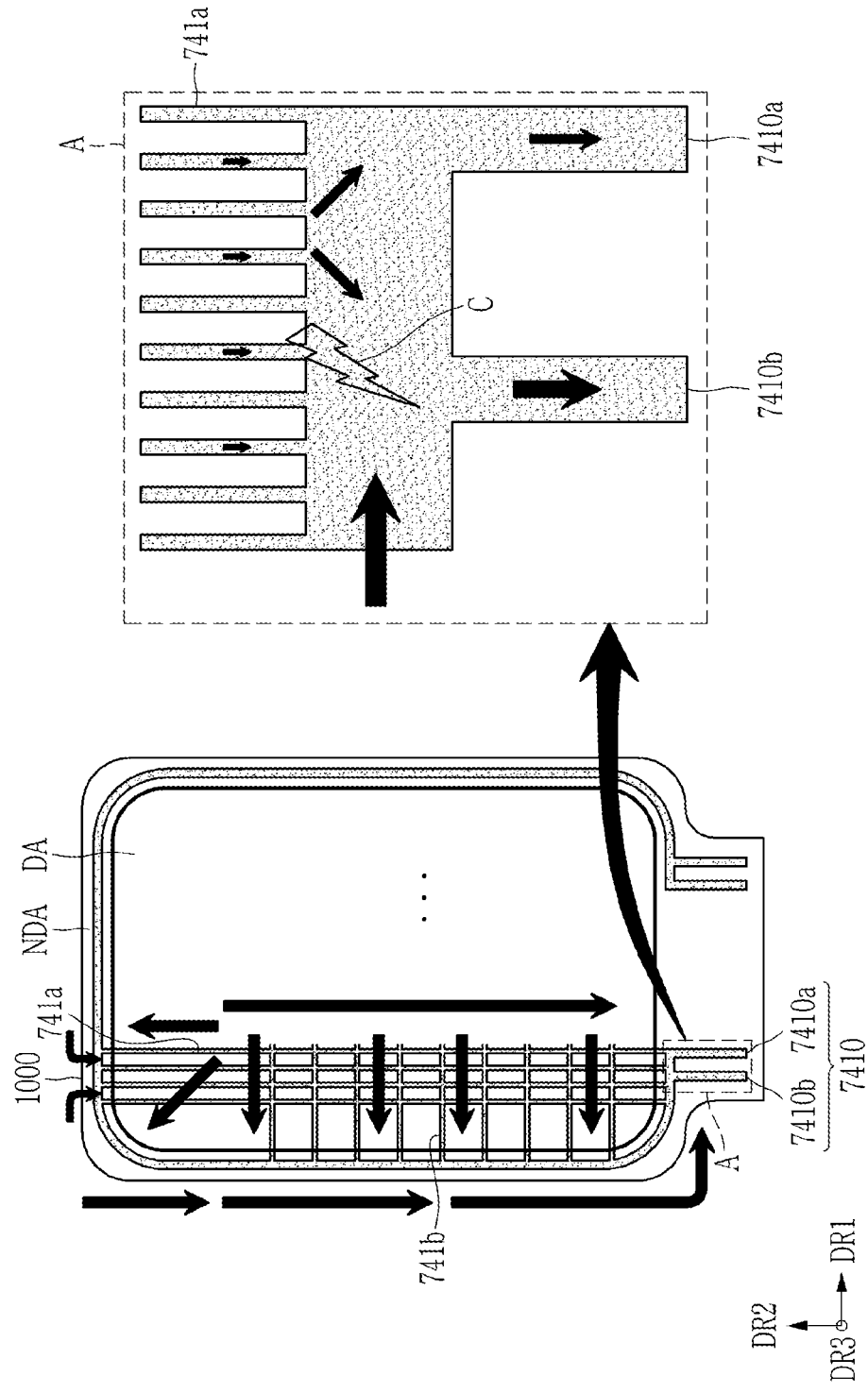
FIG. 2 is a view showing a flow of a current in a display device according to an embodiment.

FIG. 2 is a view showing a current flow in a display device 1000 according to an embodiment. In the display device 1000, the outer common voltage line 7410 does not include the groove shown in FIG. 1. The flow of current in the display device 1000 illustrated in FIG. 2 is shown by the arrows. In FIG. 2, the thickness of the arrow indicates the amount of current, and the position where significant heat is generated is indicated by C.

Referring to FIG. 2, near the second outer common voltage line 7410*b*, the current flowing from the outer common voltage line 7410 (disposed in the non-display area NDA) and the current flowing from the first common voltage line 741*a* (at least partially disposed in the display area DA) are collected. Regarding the first outer common voltage line 7410*a*, since the current flowing from the outer common voltage line 7410 flows out to the second outer common voltage line 7410*b*, only the current flowing from the common voltage line 741*a* is collected.

Therefore, more current is concentrated toward the second outer common voltage line 7410*b* than toward the first outer common voltage line 7410*a*, and thus heat generation is more significant near the second outer common voltage line 7410*b*.

Figure 3:
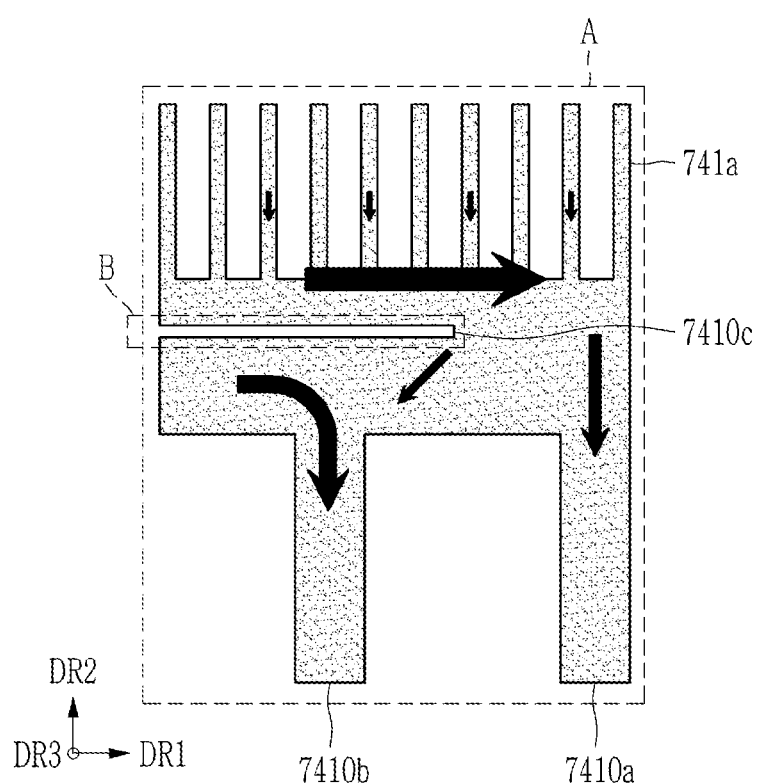
FIG. 3 is a view schematically showing a flow of a current in a display device according to an embodiment.

Referring to FIG. 1 and FIG. 3, by disposing the groove 7410*c* between the second outer common voltage line 7410*b* and a plurality of first common voltage lines 741*a*, the current of the first common voltage lines 741*a* may not significantly flow to the second outer common voltage line 7410*b*, buy may flow to the first outer common voltage line 7410*a*. Therefore, excessive heat generation may be prevented or mitigated.

FIG. 3 is a view showing a flow of a current in a display device according to an embodiment. Comparing FIG. 3 and FIG. 2, the amount of current flowing to the second outer common voltage line 7410*b* is significantly smaller in the embodiment of FIG. 3 than in the embodiment of FIG. 2. Therefore, excessive heat generation of the outer common voltage line 7410 may be effectively prevented or mitigated according to the embodiment of FIG. 3.

Figure 4:
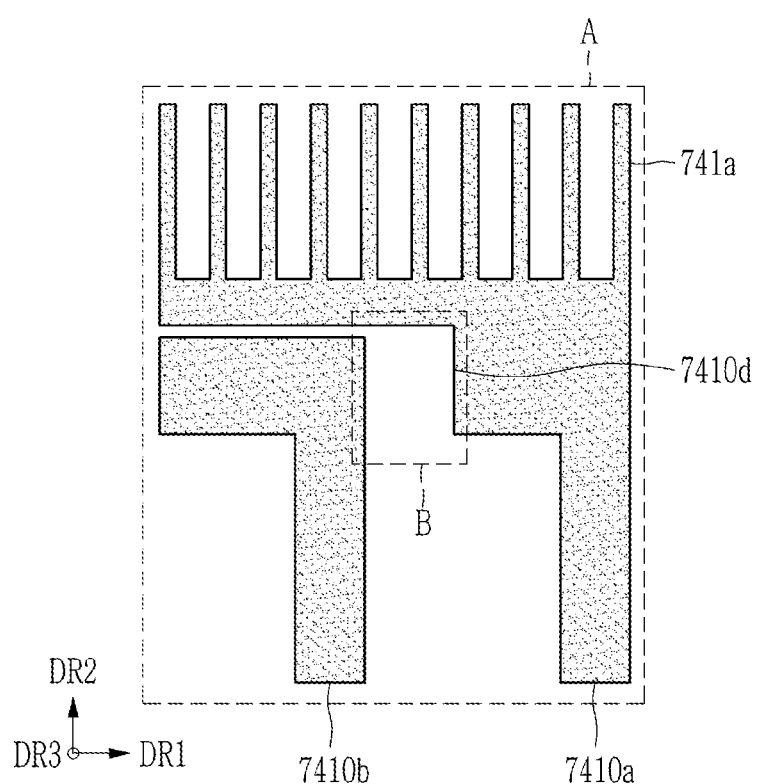
FIG. 4 is a view showing the same position as a region A of FIG. 1 in a display device according to an embodiment.

FIG. 4 is a view showing the same position as a region A of FIG. 1 in a display device according to an embodiment. Referring to FIG. 4, in the display device, the first outer common voltage line 7410*a* and the second outer common voltage line 7410*b* are separated and/or are respectively directly connected to separate trunk lines.

Referring to FIG. 4, an opening 7410*d* may separate the first outer common voltage line 7410*a* from the second outer common voltage line 7410*b*. The opening 7410*d* includes edges parallel to the first direction DR1 and includes edges parallel to the second direction DR2.

Referring to FIG. 4, the current of the first common voltage lines 741*a* is transmitted to the first outer common voltage line 7410*a* and is not transmitted to the second outer common voltage line 7410*b*. Accordingly, near the second outer common voltage line 7410*b*, undesirable heat generation may be prevented or mitigated.

Figure 5:
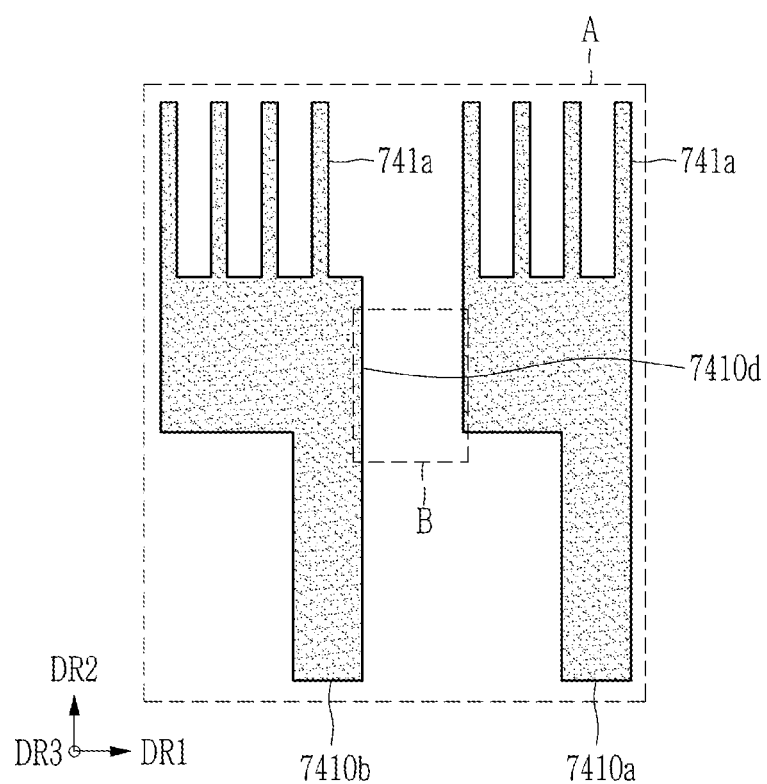
FIG. 5 is a view showing the same position as a region A of FIG. 1 in a display device according to an embodiment.

FIG. 5 is a view showing the same position as a region A of FIG. 1 in a display device according to an embodiment. Referring to FIG. 5, the first outer common voltage line 7410*a* and the second outer common voltage line 7410*c* are completely separated from each other via the opening 7410*d*, which may have opposite edges each parallel to the second direction DR2. Therefore, the amount of current flowing into the first outer common voltage line 7410*a* and the amount of current flowing into the second outer common voltage line 7410*b* may be properly controlled to prevent excessive heat generation. Even if the first outer common voltage line 7410*a* and the second outer common voltage line 7410*b* are separated from each other, as shown in FIG. 1, they are connected to each other in the display area DA by the second common voltage lines 741*b* disposed in the display area DA. Therefore, the common voltage transmitted by the first outer common voltage line 7410*a* is equal to the common voltage transmitted by the second outer common voltage line 7410*b*.

Referring to FIG. 5, the total number of first common voltage lines 741*a* directly connected to the first outer common voltage line 7410*a* may be equal or unequal to the total number of first common voltage lines directly connected to the second outer common voltage line 7410*b*. The number of first common voltage lines 741*a* directly connected to the first outer common voltage line 7410*a* may be significantly greater than the number of first common voltage lines 741*a* directly connected to the second outer common voltage line 7410*b*. In an embodiment, no first common voltage line 741*a* may be directly connected to the second outer common voltage line 7410*b*, and some first common voltage line 741*a* may be directly connected only to the first outer common voltage line 7410*a*. The number of first common voltage lines 741*a* directly connected to the first outer common voltage line 7410*a* and the number of first common voltage lines 741*a* directly connected to the second outer common voltage line 7410*b* may be appropriately selected for minimizing heat at the second outer common voltage line 7410*b*.

Figure 6:
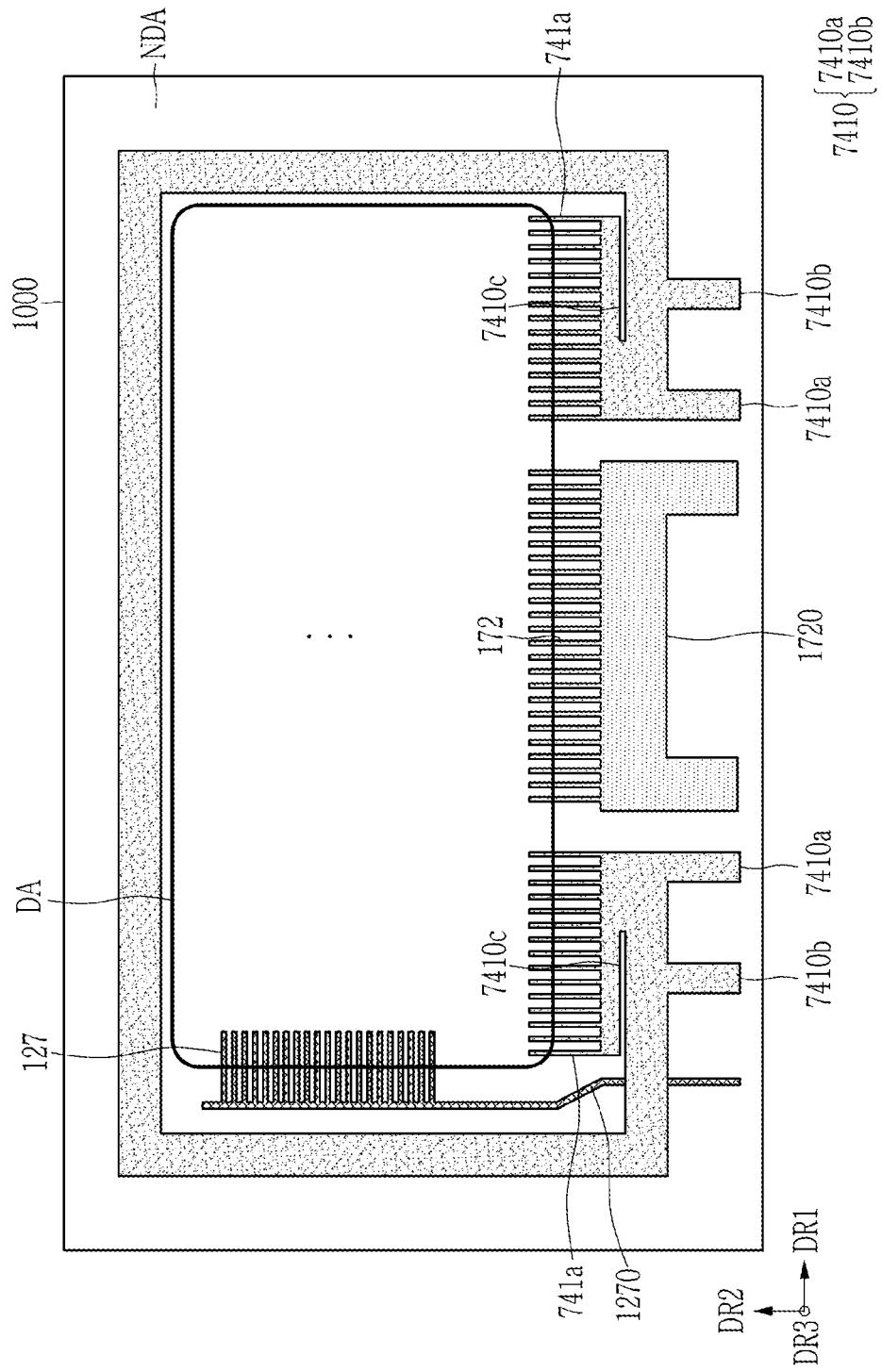
FIG. 6 is a view (e.g., a plan view) showing a display device including an outer common voltage line, an outer driving voltage line, and an outer initialization voltage line according to an embodiment.

FIG. 6 is a view showing a display device 1000 including an outer common voltage line 7410, an outer driving voltage line 1720, and an outer initialization voltage line 1270 according to an embodiment. In FIG. 6, only some wires are shown for convenience of illustration.

Referring to FIG. 6, in the non-display area NDA outside the display area DA, the outer common voltage line 7410 may substantially surround the display area DA. The outer driving voltage line 1720 may be disposed between opposite section of the outer common voltage line 7410.

TA first outer common voltage line 7410*a* and a second outer common voltage line 7410*b* may protrude from the outer common voltage line 7410, and a groove 7410*c* is disposed between a first outer common voltage line 7410*a* and the second outer common voltage line 7410*b*. The outer common voltage line 7410 may be connected to the first common voltage line 741*a* and a second common voltage line (analogous to a second common voltage line 741*b* shown in FIG. 1) that extend to the display area DA. In the display area DA, the first common voltage line 741*a* may be lengthwise in the second direction DR2, and the second common voltage line may be lengthwise in the first direction DR1.

The outer driving voltage line 1720 may be disposed between opposite ends of the outer common voltage line 7410. The outer driving voltage line 1720 may be disposed in a space between opposite sections of the outer common voltage lines 7410. The outer driving voltage line 1720 transmits the driving voltage ELVDD to the display area DA.

Figure 12:
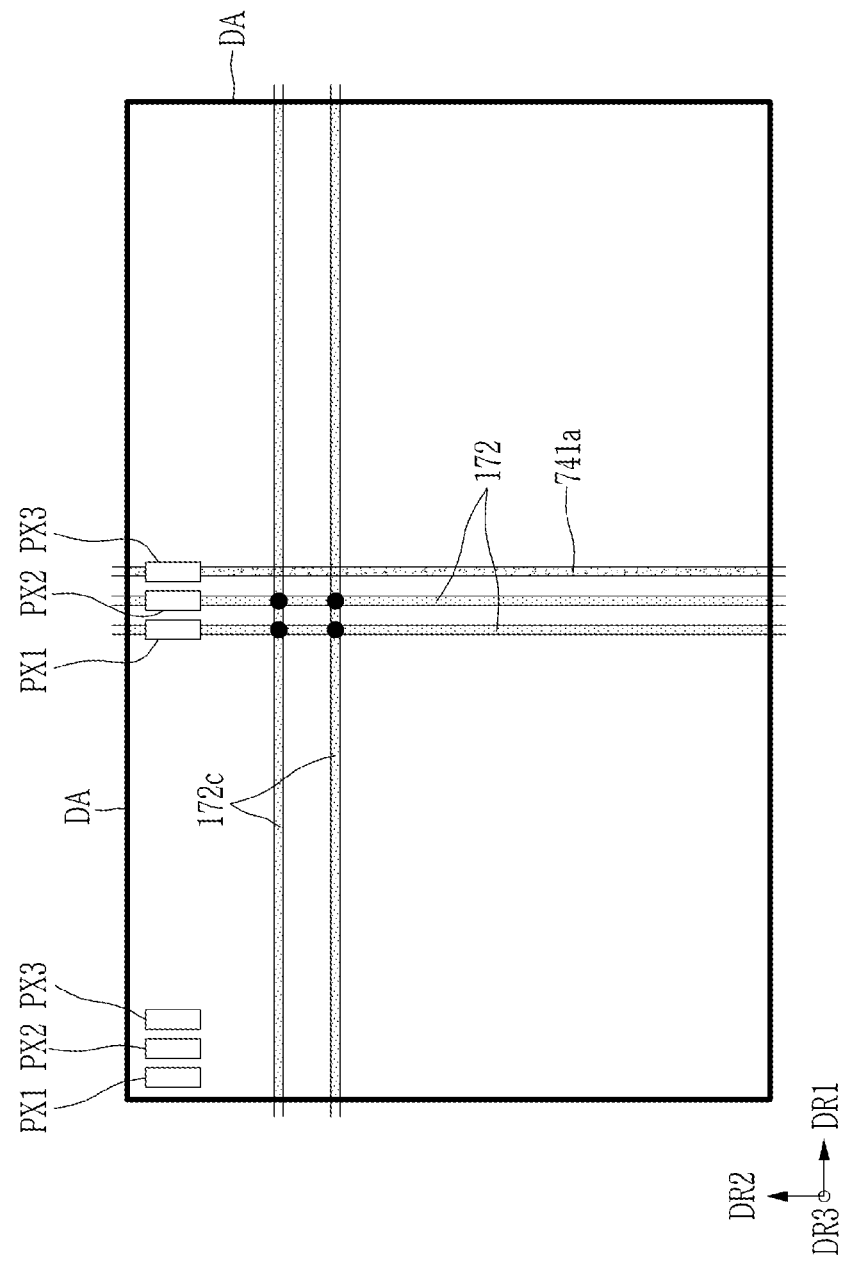
FIG. 12 is a view (e.g., a plan view) showing a display area DA in a display device according to an embodiment.

The outer driving voltage line 1720 is directly connected to driving voltage lines 172, which may be at least partially disposed in the display area DA. The driving voltage lines 172 may be lengthwise in the second direction DR2. Referring to FIG. 6 and FIG. 12, driving voltage connection lines 172*c* may be lengthwise in the first direction DR1 and may be at least partially disposed in the display area DA. The driving voltage connection lines 172*c* may cross the driving voltage lines 172 for evenly transmitting the driving voltage in the display area DA. The driving voltage line 172 and the driving voltage connection line 172*c* are form a mesh in the display area DA and are connected to each other, so that pixels not directly connected to the driving voltage line 172 may also receive the driving voltage ELVDD.

The outer initialization voltage line 1270 is disposed between the outer common voltage line 7410 and the display area DA. The outer initialization voltage line 1270 is directly connected to initialization voltage line 127, which may be at least partially disposed in the display area DA and may transmit an initialization voltage to the display area DA. The initialization voltage lines 127 may be lengthwise in the first direction DR1.

Although not shown in FIG. 6, a second common voltage line lengthwise in the first direction DR1 may be at least partially disposed in the display area DA. The number and position of the wires/lines shown in FIG. 6 may be configured according to embodiments.

Although only portions of the first common voltage lines 741*a* are shown in FIG. 6, the first common voltage lines 741*a* may be connected to sections of the outer common voltage line 7410 disposed at opposite sides of the display area DA. The driving voltage line 172 may also extend in the second direction from one edge of the display area DA to another edge of the display area DA. In embodiments, outer initialization voltage lines 1270 may be disposed at two or more sides of the display area DA. The initialization voltage lines 127 may extend in the first direction DR1 from one edge of the display area DA to another edge of the display area DA.

Figure 7:
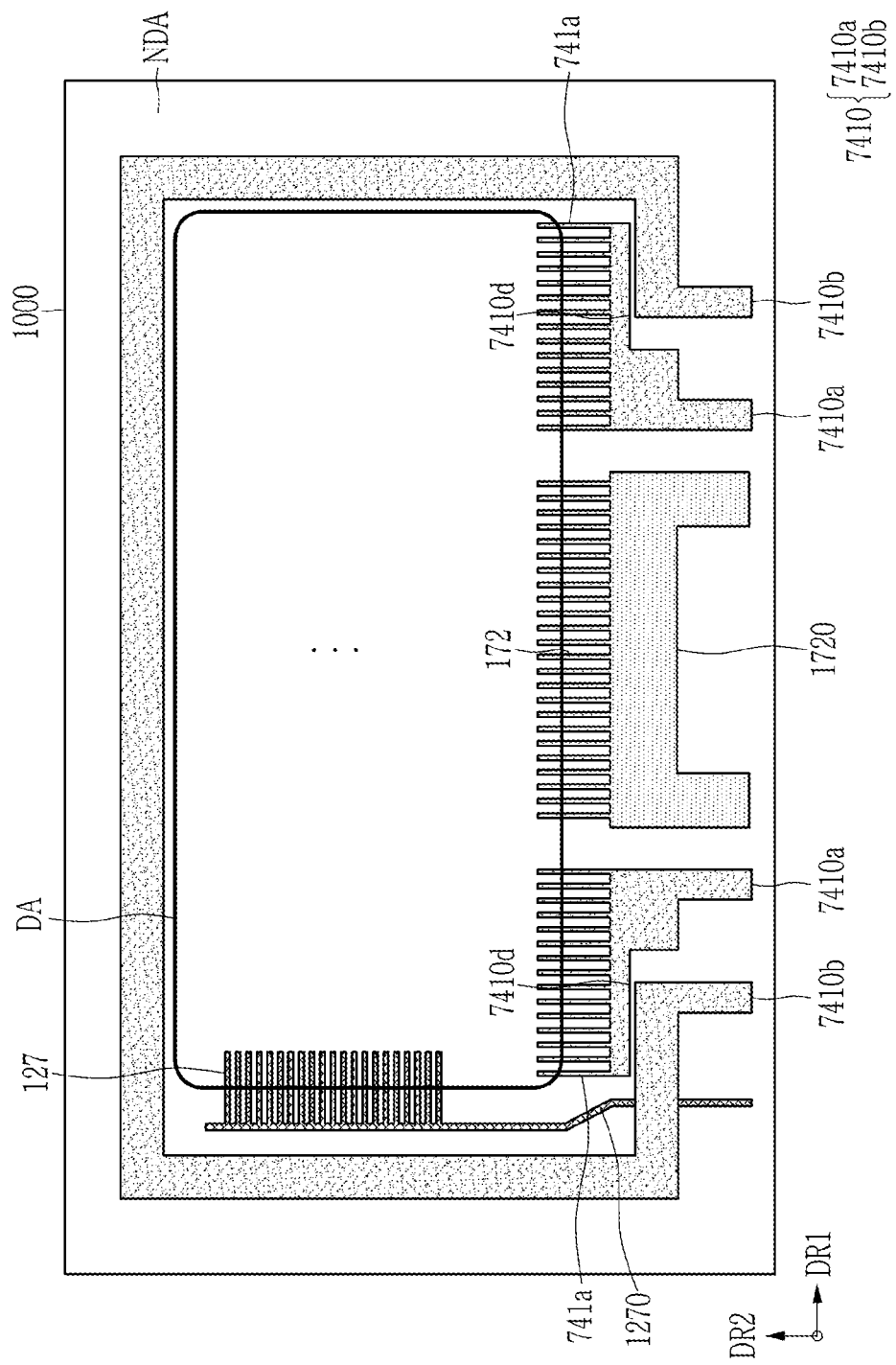
FIG. 7 is a view showing a display device according to an embodiment.

FIG. 7 is a view showing a display device according to an embodiment. Referring to FIG. 7, a first outer common voltage line 7410*a* and a second outer common voltage line 7410*b* are separated by a gap/opening. No first common voltage lines 741a may be directly connected to the second outer common voltage line 7410b.

The first outer common voltage line 7410a and the second outer common voltage line 7410b are separated by the opening 7410d, which may have opposite edges parallel to the first direction DR1 and may have opposite edges parallel to the second direction DR2. The current of the first common voltage lines 741a is transmitted to the first outer common voltage line 7410a. Thus, the current is not concentrated in the second outer common voltage line 7410b, and excessive heat generation may be prevented. The first outer common voltage line 7410a and the second outer common voltage line 7410b may be electrically connected to each other through the second common voltage lines 741b disposed in the display area DA, so the common voltage transmitted by the first outer common voltage line 7410a is equal to the common voltage transmitted by the second outer common voltage line 7410b.

Figure 8:
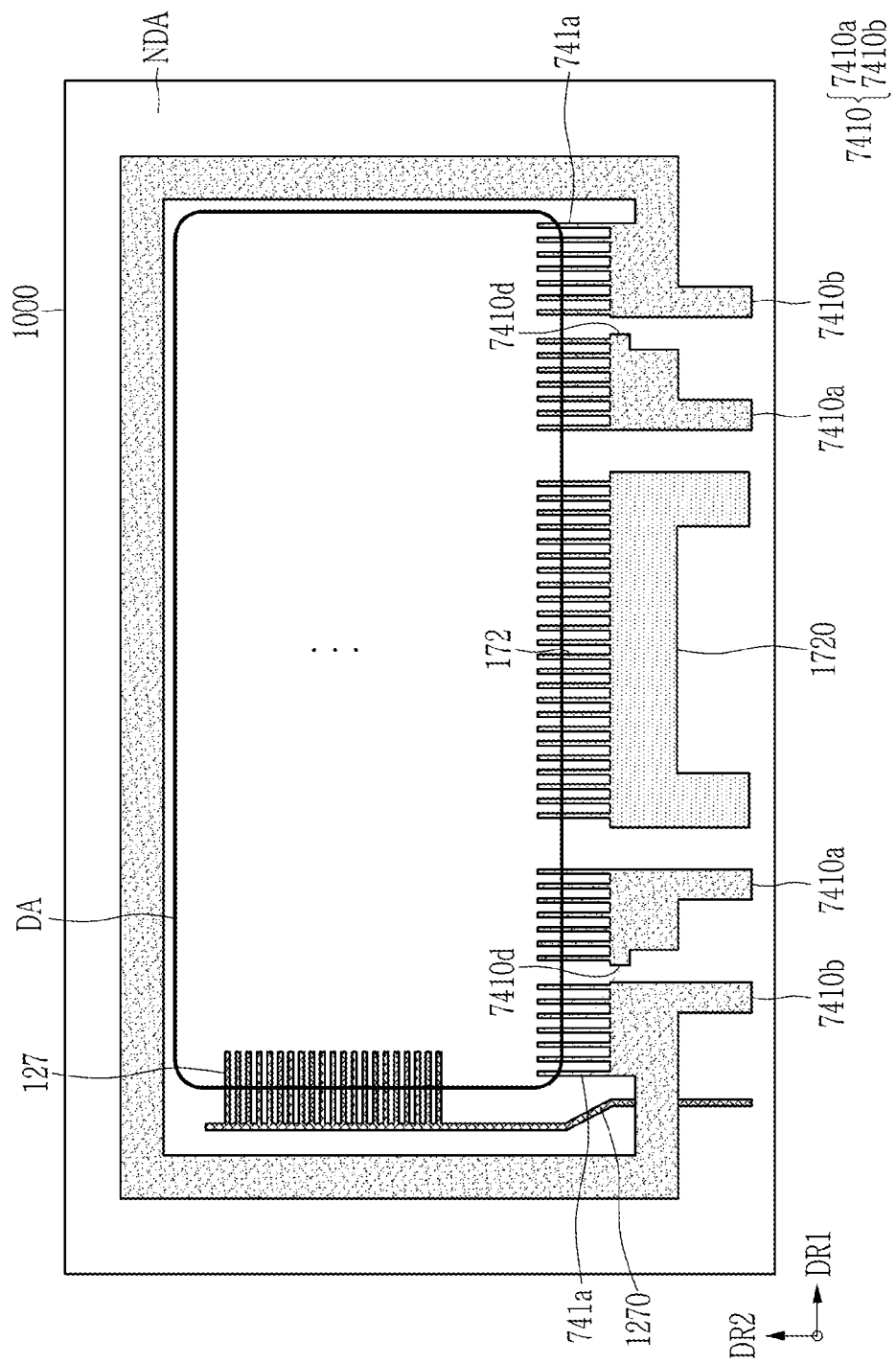
FIG. 8 is a view showing a display device according to an embodiment.

FIG. 8 is a view showing a display device according to an embodiment. Referring to FIG. 8, the first outer common voltage line 7410a and the second outer common voltage line 7410b are separated. Referring to FIG. 8, the opening 7410d may have opposite edges that are lengthwise in the second direction DR2. The operation and effect are similar to those in the embodiment of FIG. 7.

Figure 9:
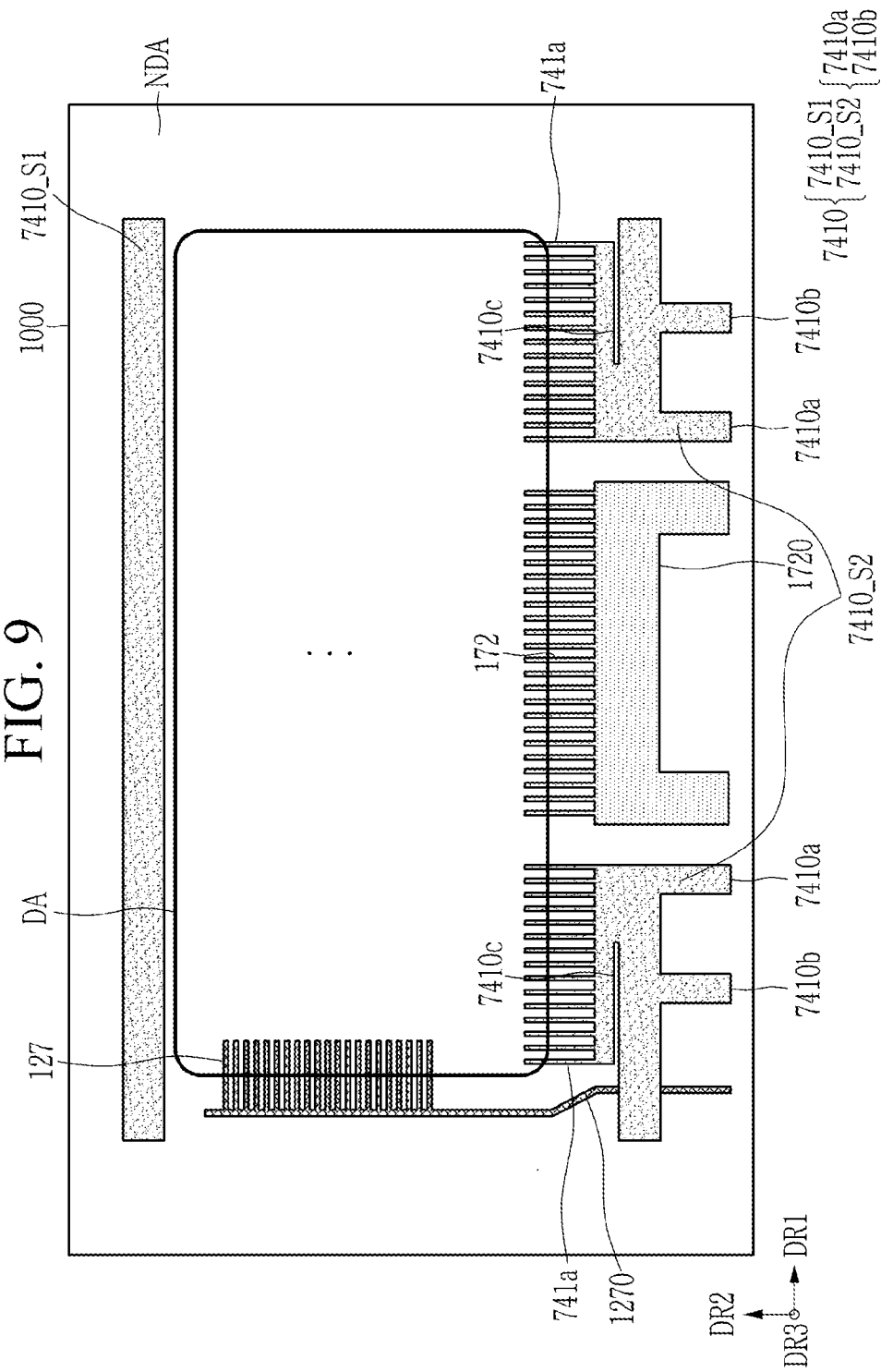
FIG. 9 is a view showing a display device according to an embodiment.

FIG. 9 is a view showing a display device according to an embodiment. Referring to FIG. 9, outer common voltage lines 7410 are disposed at opposite sides of the display area DA.

The display area DA may not be disposed between outer common voltage lines in the first direction DR1. Referring to FIG. 9, the outer common voltage lines 7410 may include a first outer common sub-voltage line 7410_S1 and a second outer common sub-voltage line 7410_S2. The second outer common sub-voltage line 7410_S2 may include a first-second outer common sub-voltage line 7410_S2 as shown at the bottom left of FIG. 9 and a second-second outer common sub-voltage line 7410_S2 as shown at the bottom right of FIG. 9.

The first outer common sub-voltage line 7410_S1 and the second outer common sub-voltage line 7410_S2 may be electrically connected through first common voltage lines 741a, which may be at least partially disposed in the display area DA. Therefore, the common voltage ELVSS may be substantially uniformly provided over the display area DA. Since no the outer common voltage lines are not disposed at the left and ride sides of the display area DA, the left and right non-display areas NDA may be minimized.

Figure 10:
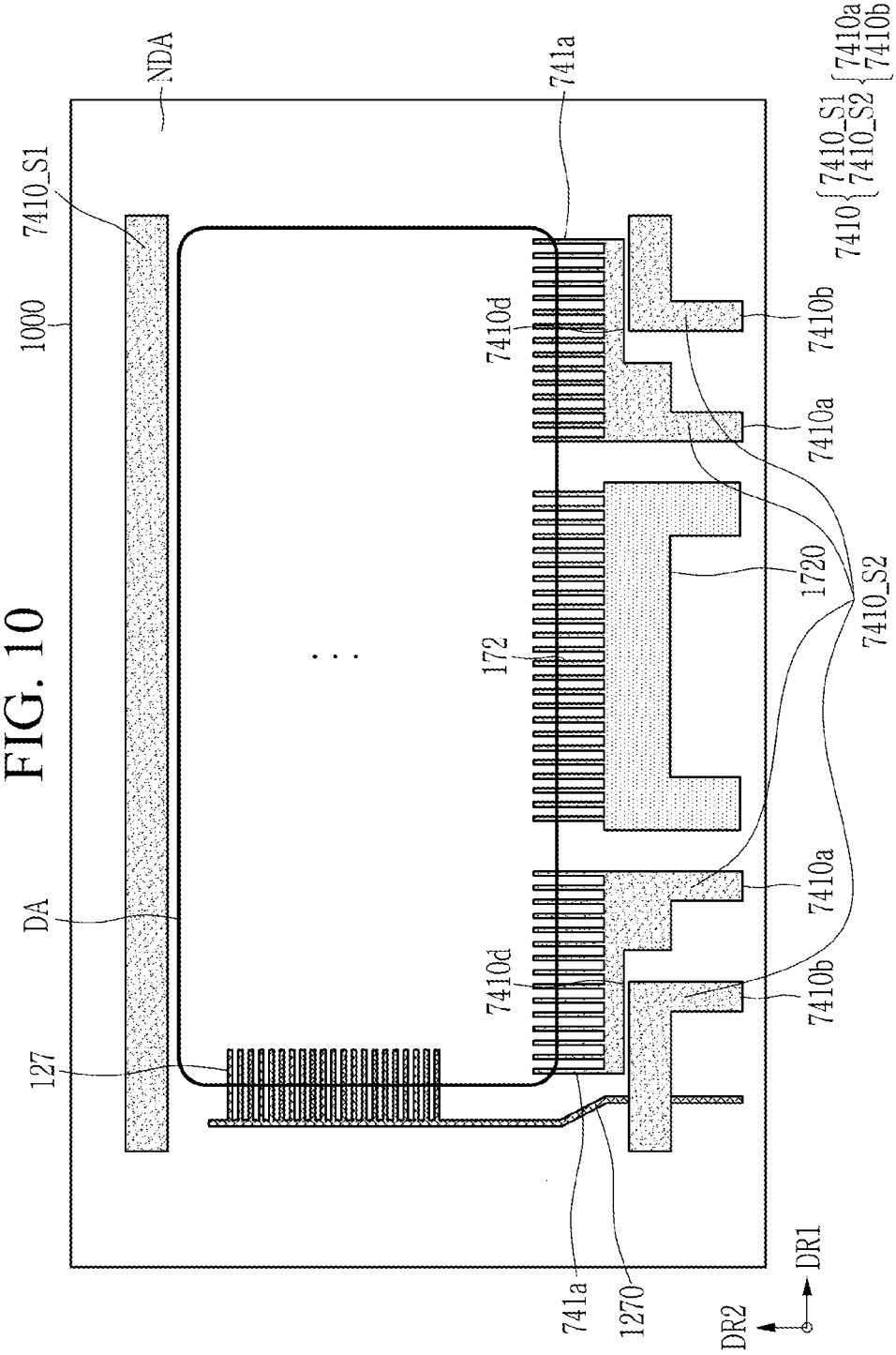
FIG. 10 is a view showing a display device according to an embodiment.

FIG. 10 is a view showing a display device according to an embodiment. Referring to FIG. 10, outer common voltage lines 7410_S1 and 7410_S2 are disposed at opposite sides of the display area DA. Outer common voltage lines 7410_S2 are spaced in the first direction DR1 and in the second direction DR2. The effect of the separation of the outer common voltage lines 7410 is the same as or analogous to that described with reference to FIG. 9.

Figure 11:
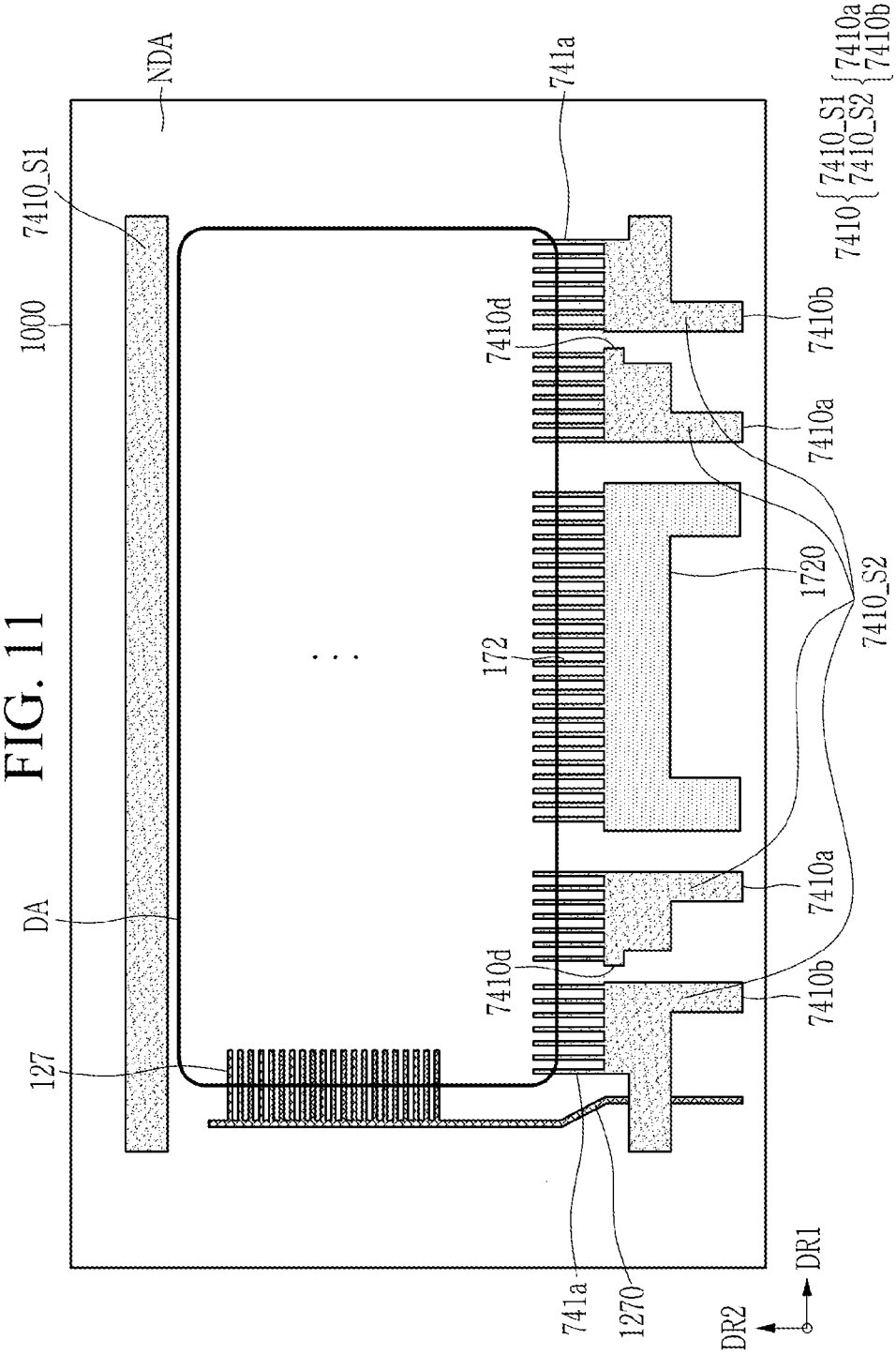
FIG. 11 is a view showing a display device according to an embodiment.

FIG. 11 is a view showing a display device according to an embodiment. Referring to FIG. 11, outer common voltage lines 7410_S1 and 7410_S2 are disposed at opposite sides of the display area DA. Outer common voltage lines 7410_S2 are spaced in the first direction DR1. In FIGS. 10 and 11, the second outer common sub-voltage line 7410_S2 may include a first-second outer common sub-voltage line 7410_S2 as shown at the bottom left of FIGS. 10-11, a second-second outer common sub-voltage line 7410_S2 as shown at the bottom right of FIGS. 10-11, a third-second outer common sub-voltage line 7410_S2 as shown between the first-second outer common sub-voltage line 7410_S2 at the bottom left of FIGS. 10-11 and the outer driving voltage line 1720, and a fourth-second outer common sub-voltage line 7410_S2 as shown between second-second outer common sub-voltage line 7410_S2 as shown at the bottom right of FIGS. 10-11 and the outer driving voltage line 1720. The effect of the separation of the outer common voltage lines 7410 is the same as or analogous to that described in FIG. 9.

One or more structures of the display area DA described with reference to one or more of FIG. 12 to FIG. 15 may be applicable to the display area DA described with reference to one or more of FIG. 6 to FIG. 11.

FIG. 12 is a view showing a display area DA in a display device according to an embodiment. Referring to FIG. 12, one of the driving voltage lines 172 connected to the plurality of pixels PX1, PX2, and PX3 is replaced by a first common voltage line 741a. Therefore, the outer common voltage line 7410 disposed via the display area DA in the second direction DR2 may be connected. When separate outer common voltage lines 7410 are disposed at opposite sides of the display area DA, as shown in FIG. 9 to FIG. 11, the first common voltage line 741a may electrically connect the separate outer common voltage lines 7410. Referring to FIG. 6 to FIG. 8, even if the outer common voltage lines 7410 are electrically connected in the non-display area NDA, the common voltage is transmitted to the first common voltage line 741a inside the display area DA, such that the common voltage may be uniformly provided in the display area DA.

Referring to FIG. 12, driving voltage connection lines 172c may cross driving voltage lines 172. The driving voltage connection lines 172c may be electrically connected to the driving voltage lines 172 at the cross points. Therefore, the driving voltage transmitted to a driving voltage line 172 may be transmitted to neighboring pixels. The driving voltage connection line 172c may be disposed on a different layer than the driving voltage line 172.

Figure 13:
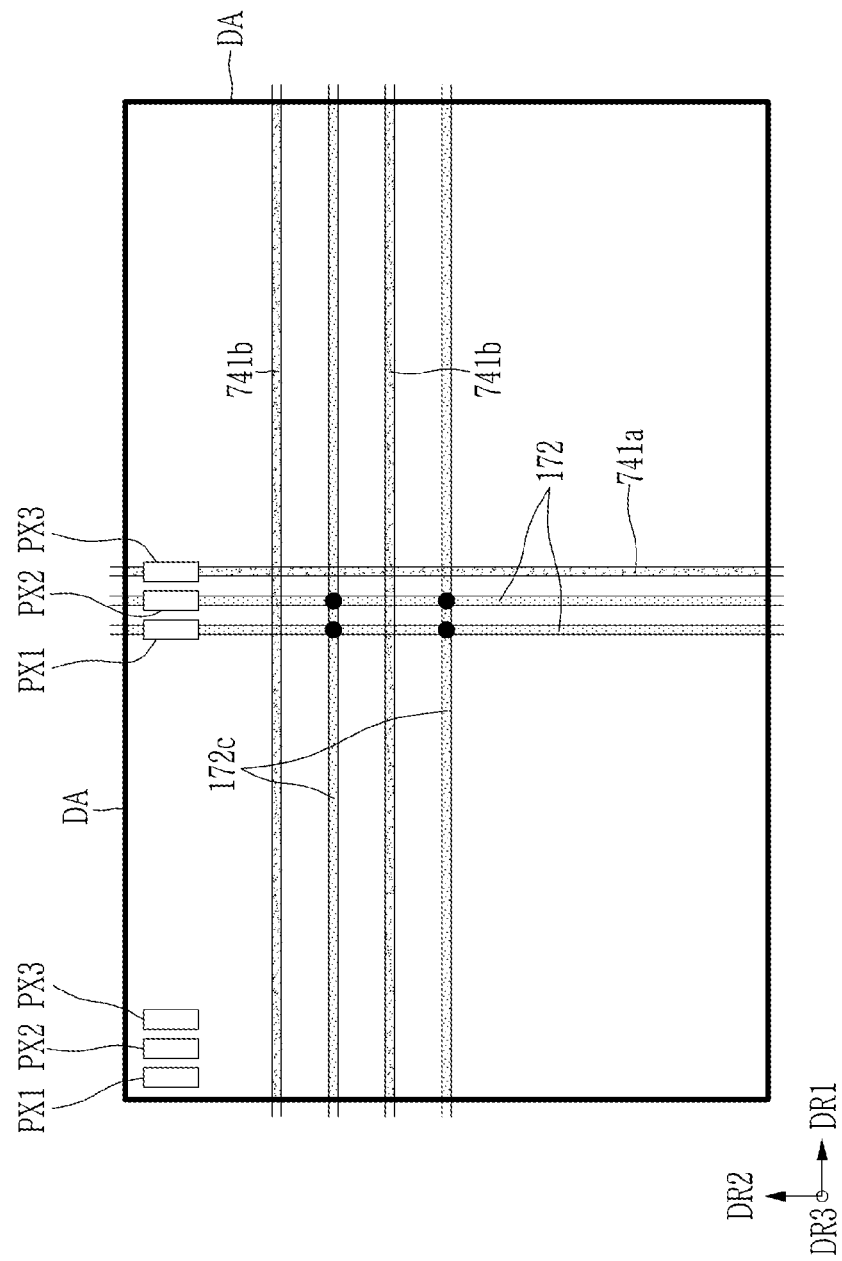
FIG. 13 is a view showing a display area DA in a display device according to an embodiment.

FIG. 13 is a view showing a display area DA in a display device according to an embodiment. The display area DA according to the embodiment of FIG. 13 is the same as embodiment of FIG. 12, except for further including the second common voltage line 741b. The first common voltage line 741a may be disposed parallel to the second direction DR2, and the second common voltage line 741b may be disposed parallel to the first direction DR1.

The display device according to the embodiment of FIG. 13 includes a mesh structure where the first common voltage line 741a and the second common voltage line 741b intersect. In this case, the reduction of the common voltage ELVSS may be effectively prevented. The common voltage ELVSS is evenly transmitted to the pixels in the display area DA along the common voltage lines 741a and 741b having a mesh structure.

Figure 14:
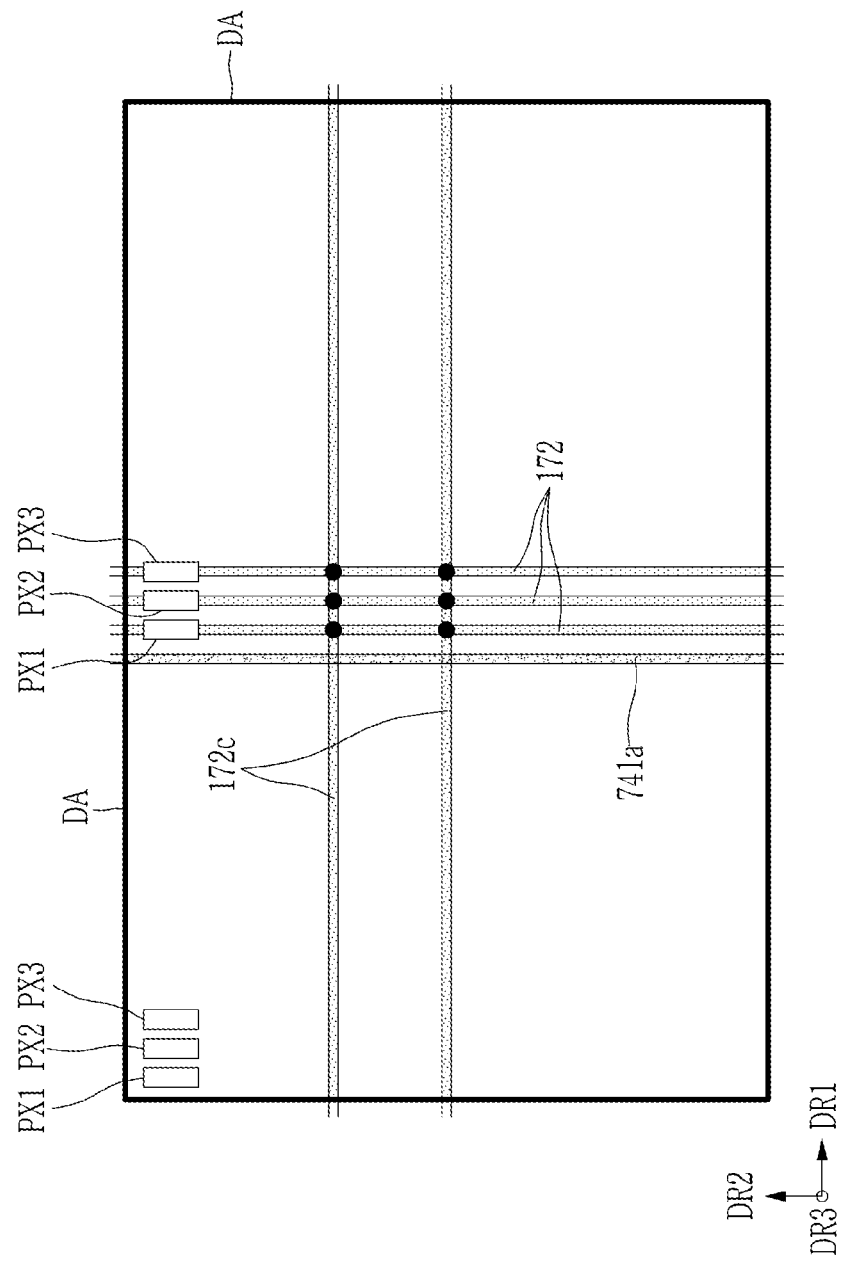
FIG. 14 is a view showing a display area DA in a display device according to an embodiment.

FIG. 14 is a view showing a display area DA in a display device according to an embodiment. Referring to FIG. 14, the display device is different from that of FIG. 12 in that the structure (and/or material) of a first common voltage line 741a may be substantially different from the structure (and/or material) of each of the driving voltage lines 172 connected to the pixels PX1, PX2, and PX3. The first common voltage line 741a may be formed without removing any existing driving voltage line 172.

Figure 15:
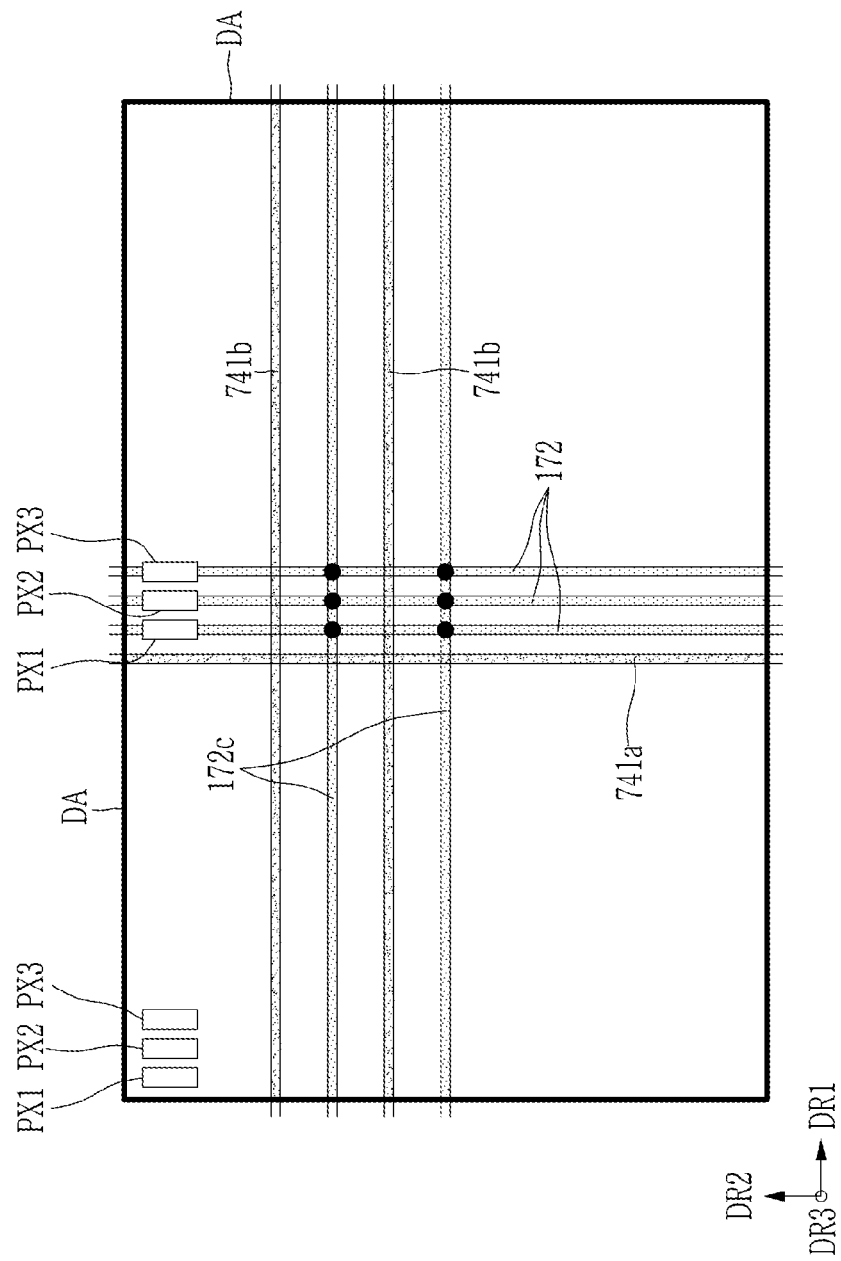
FIG. 15 is a view showing a display area DA in a display device according to an embodiment.

FIG. 15 is a view showing a display area DA in a display device according to an embodiment. FIG. 15 is the same as the display device according to the embodiment of FIG. 13, except that a first common voltage line 741a is additionally formed without removing a driving voltage line 172 in the display area DA.

In FIG. 12 to FIG. 15, the driving voltage connection line 172c, the driving voltage line 172, and the first common voltage line 741a may be respectively directly disposed on different material layers. The driving voltage connection line 172c and the driving voltage line 172 are disposed on different layers, but are connected to each other through a contact hole so that the driving voltage may be evenly transmitted.

Figure 16:
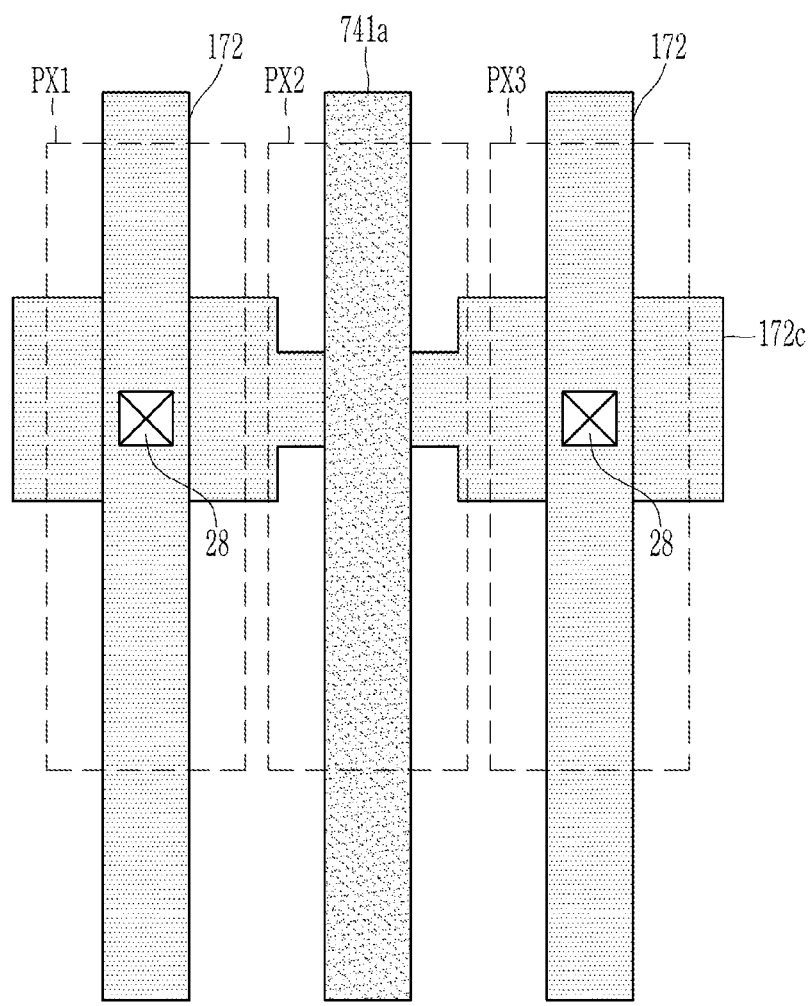
FIG. 16 is a view (e.g., a plan view) schematically showing structures of a driving voltage connection line, a driving voltage line, and a first common voltage line in a display area.

FIG. 16 is a view schematically showing structures of a driving voltage connection line 172c, a driving voltage line 172, and a first common voltage line 741a in a display area. In FIG. 16, PX1, PX2, and PX3 are labeled to distinguish the pixels to which wires are connected.

Referring to FIG. 16, the driving voltage connection line 172c, the driving voltage line 172, and the first common voltage line 741a are located on different layers, respectively. For example, the driving voltage connection line 172c may be disposed between the substrate and the driving voltage line 172; the driving voltage connection line 172c and the driving voltage line 172 may be disposed between the substrate and the first common voltage line 741a. In embodiments, the driving voltage line 172 and the first common voltage line 741a may be disposed directly on the same layer.

Referring to FIG. 16, a width of the driving voltage connection line 172c overlapping the first common voltage line 741a may be narrower than a width of the driving voltage connection line 172c overlapping a driving voltage line 172. Therefore, the risk of the first common voltage line 741a and the driving voltage connection line 172c being shorted to each other may be reduced. The driving voltage connection line 172c and the driving voltage line 172 are connected to each other through a contact hole 28.

Figure 17:
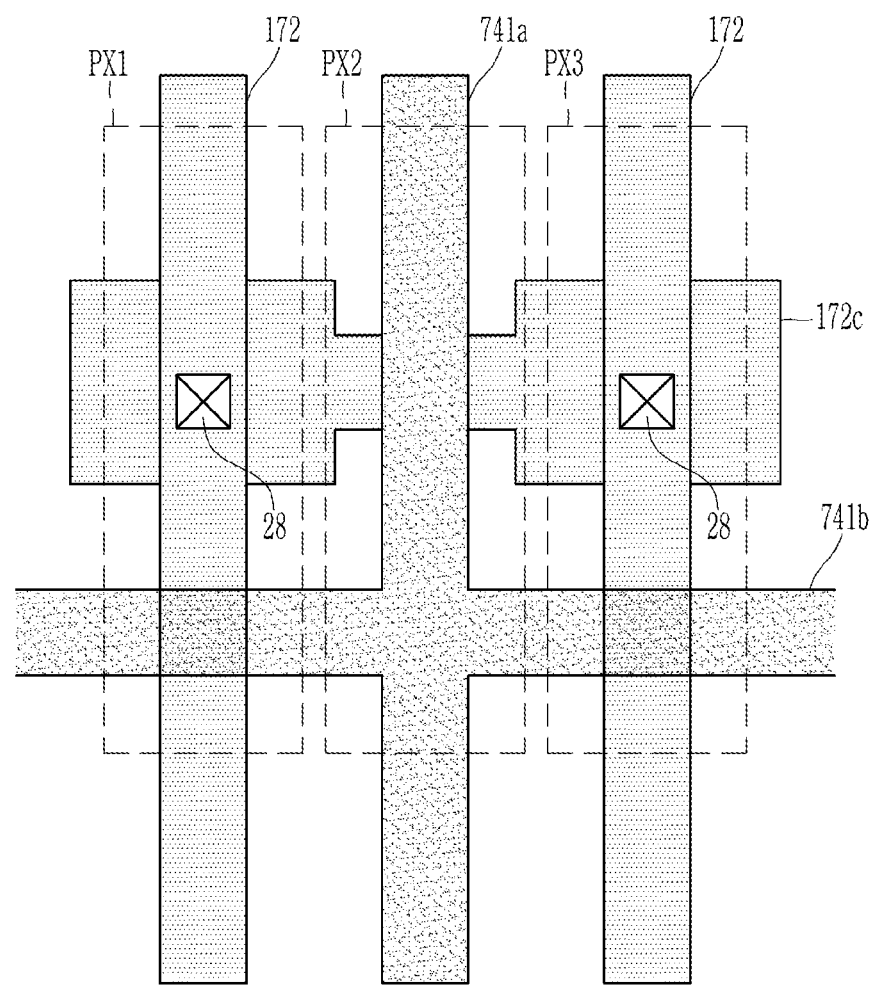
FIG. 17 is a view schematically showing structures of a driving voltage connection line, a driving voltage line, a first common voltage line, and a second common voltage line within a display area in a display device according to an embodiment.

FIG. 17 is a view schematically showing structures of a driving voltage connection line 172c, a driving voltage line 172, a first common voltage line 741a, and a second common voltage line 741b within a display area in a display device according to an embodiment. The first common voltage line 741a is connected to the second common voltage line 741b.

The first common voltage line 741a and the second common voltage line 741b may be disposed on the same layer and directly connected to each other. The common voltage lines 741a and 741b may form of a mesh. The common voltage lines 741a and 741b may be separated and insulated from the driving voltage line 172 by an intervening insulating layer. The driving voltage line 172 may be disposed closer to the substrate than the common voltage lines 741a and 741b.

Figure 18:
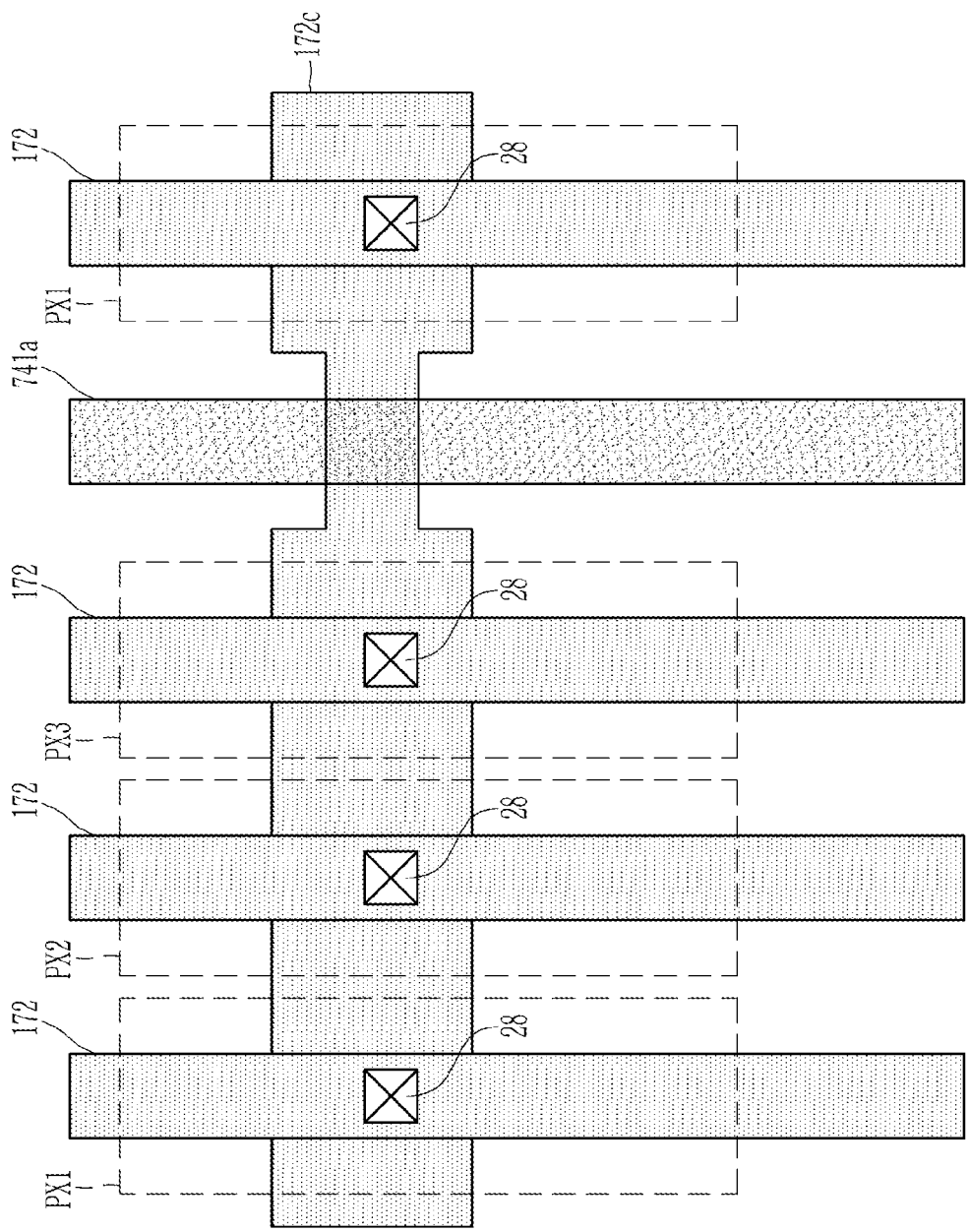
FIG. 18 is a view schematically showing structures of a driving voltage connection line, a driving voltage line, and a first common voltage line within a display area in a display device according to an embodiment.

FIG. 18 is a view schematically showing structures of a driving voltage connection line 172c, a driving voltage line 172, and a first common voltage line 741a within a display area in a display device according to an embodiment. Referring to FIG. 18, the first common voltage line 741a is disposed outside the pixels PX1, PX2, and PX3. The first common voltage line 741a is disposed without removing the existing driving voltage line 172. Each driving voltage line 172 is connected to a pixel PX1, PX2, or PX3, and the first common voltage line 741a is disposed between two pixel groups each including pixels PX1, PX2, and PX3. The first common voltage line 741a may be disposed directly on the same layer as the driving voltage lines 172.

Figure 19:
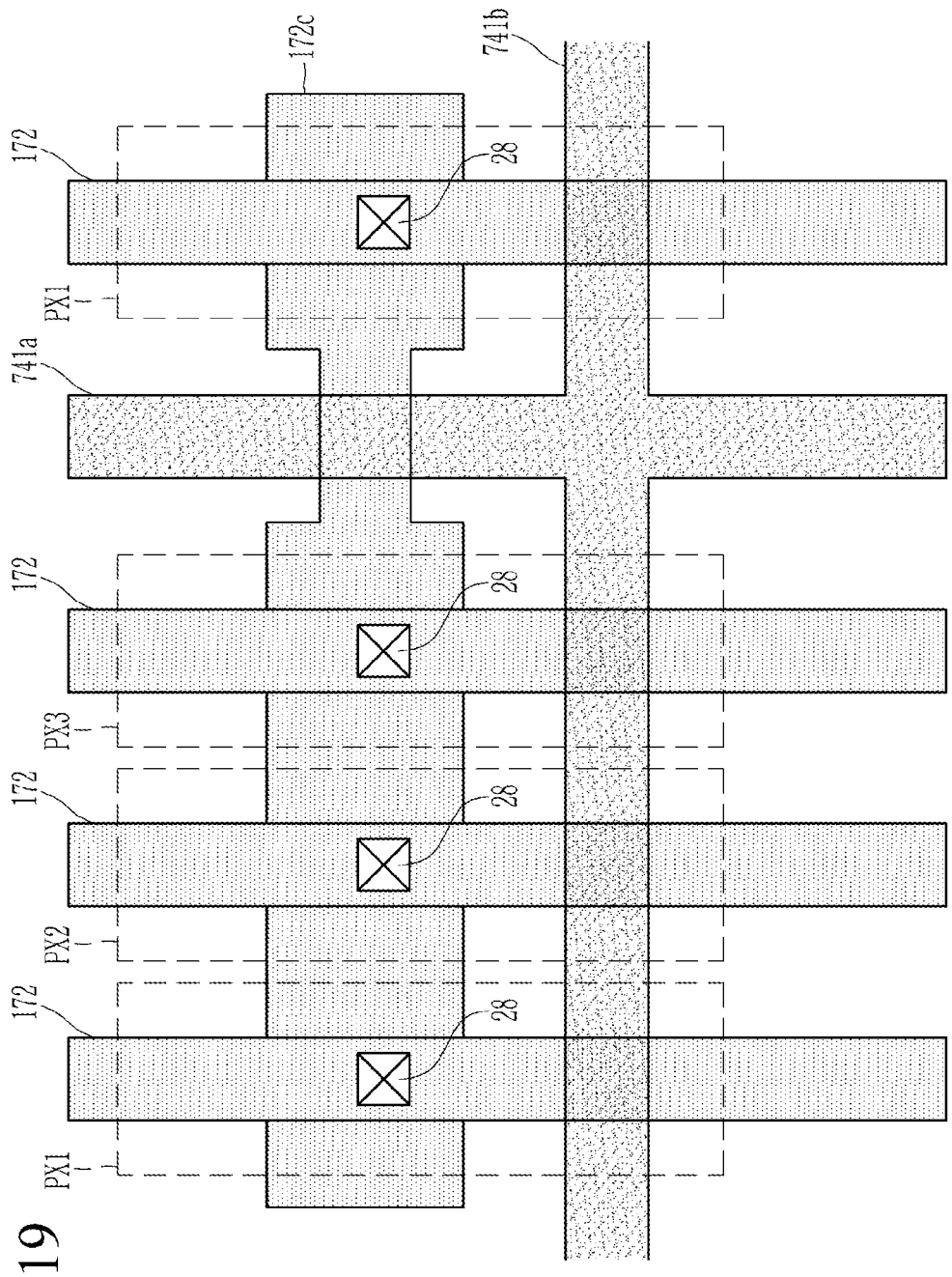
FIG. 19 is a view schematically showing structures of a driving voltage connection line, a driving voltage line, a first common voltage line, and a second common voltage line within a display area in a display device according to an embodiment.

FIG. 19 is a view schematically showing structures of a driving voltage connection line 172c, a driving voltage line 172, and a first common voltage line 741a within a display area in a display device according to an embodiment. Common voltage lines include a first common voltage line 741a and a second common voltage line 741b.

The first common voltage line 741a and the second common voltage line 741b may be disposed on the same layer and directly connected to each other. The display device may include a mesh structure, wherein first common voltage lines 741a cross second common voltage lines 741b. The common voltage lines 741a and 741b may be separated and insulated from the driving voltage line 172 by an intervening insulating layer. The driving voltage line 172 may be disposed closer to the substrate than the common voltage lines 741a and 741b.

Figure 20:
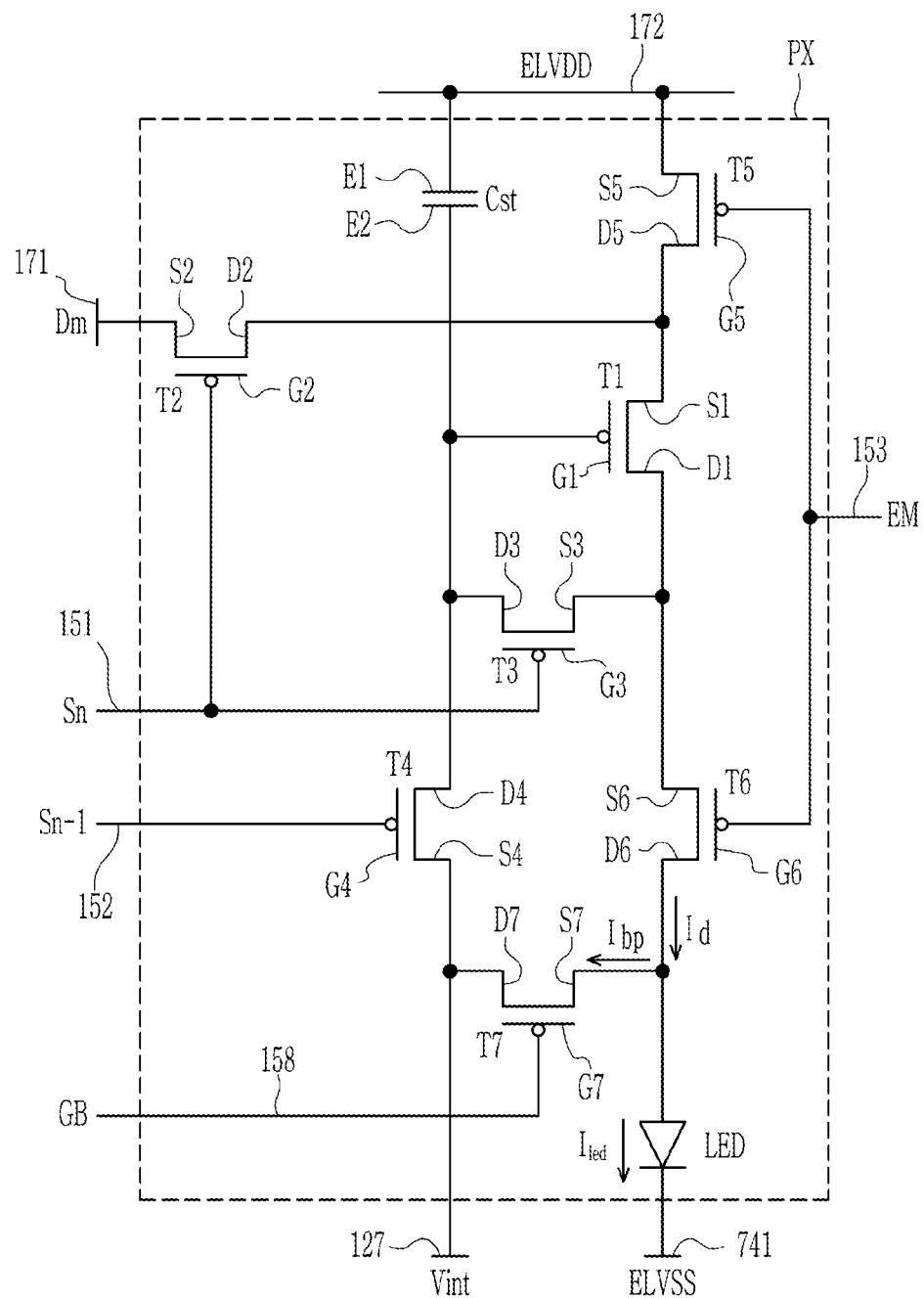
FIG. 20 is an equivalent circuit diagram of one pixel of an emissive display device according to an embodiment.

FIG. 20 is an equivalent circuit diagram of one pixel of an emissive display device according to an embodiment.

Referring to FIG. 20, the pixel PX of the emissive display device includes a plurality of transistors T1, T2, T3, T4, T5, T6, and T7, a storage capacitor Cst, and a light emitting diode (LED), which are connected to several signal lines 127, 151, 152, 153, 158, 171, 172, and 741.

The emissive display device includes the display area displaying the image, and these pixels PX are arranged in various forms in the display area.

The plurality of transistors T1, T2, T3, T4, T5, T6, and T7 include a driving transistor T1, a switching transistor connected to a scan line 151, that is, includes a second transistor T2 and a third transistor T3, and the rest of the transistors are a transistors (hereinafter referred to as compensation transistors) required to operate the light emitting diode (LED). The compensation transistors T4, T5, T6, and T7 may include a fourth transistor T4, a fifth transistor T5, a sixth transistor T6, and a seventh transistor T7.

The plurality of signal lines 127, 151, 152, 153, 158, 171, 172, and 741 may include the scan line 151, a previous scan line 152, a light emission control line 153, a bypass control line 158, a data line 171, the driving voltage line 172, an initialization voltage line 127, and a common voltage line 741. The bypass control line 158 may be a part of the previous scan line 152 or may be electrically connected thereto.

The scan line 151 is connected to a gate driver, and transmits a scan signal Sn to the second transistor T2 and the third transistor T3. The previous scan line 152 is connected to the gate driver, and transmits a previous scan signal Sn−1 applied to the pixel PX positioned at the previous stage to the fourth transistor T4. The light emission control line 153 is connected to a light emission controller, and transmits a light emission control signal EM that controls the time that the light emitting diode (LED) emits light to the fifth transistor T5 and the sixth transistor T6. The bypass control line 158 transmits a bypass signal GB to the seventh transistor T7.

The data line 171 is a wire for transmitting a data voltage Dm generated by a data driver, and the luminance of the light emitting diode (LED) (also called a light-emitting element) changes according to the data voltage Dm. The driving voltage line 172 applies a driving voltage ELVDD. The initialization voltage line 127 transmits an initialization voltage Vint that initializes the driving transistor T1. The common voltage line 741 applies a common voltage ELVSS. The voltages applied to the driving voltage line 172, the initialization voltage line 127, and the common voltage line 741 may be applied with a constant voltage, respectively.

The driving transistor T1 is for adjusting the magnitude of the current output according to the applied data voltage Dm. The output driving current (Id) is applied to the light emitting diode (LED) to adjust the brightness of the light emitting diode (LED) according to the data voltage Dm. For this purpose, the first electrode S1 of the driving transistor T1 may allow the driving voltage ELVDD to be applied. The first electrode S1 is connected to the driving voltage line 172 via the fifth transistor T5. In addition, the first electrode S1 of the driving transistor T1 is also connected to the second electrode D2 of the second transistor T2 to receive the data voltage Dm. The second electrode D1 (an output electrode) of the driving transistor T1 may output the current toward the light emitting diode (LED). The second electrode D1 of the driving transistor T1 is connected to the anode of the light emitting diode (LED) via the sixth transistor T6. On the other hand, the gate electrode G1 is connected to one electrode (a second storage electrode E2) of the storage capacitor Cst. The voltage of the gate electrode G1 changes according to the voltage stored in the storage capacitor Cst, thereby the driving current Id output by the driving transistor T1 changes.

The second transistor T2 receives the data voltage Dm into the pixel PX. The gate electrode G2 is connected to the scan line 151 and the first electrode S2 is connected to the data line 171. The second electrode D2 of the second transistor T2 is connected to the first electrode S1 of the driving transistor T1. When the second transistor T2 is turned on according to a scan signal Sn transmitted through the scan line 151, the data voltage Dm transmitted through the data line 171 is transferred to the first electrode S1 of the driving transistor T1.

The third transistor T3 transmits a compensation voltage (Dm+Vth) from the driving transistor T1 to the second storage electrode E2 of the storage capacitor Cst. The gate electrode G3 is connected with scan line 151, and the first electrode S3 is connected to the second electrode D1 of the driving transistor T1. The second electrode D3 of the third transistor T3 is connected to the second storage electrode E2 of the storage capacitor Cst and the gate electrode G1 of the driving transistor T1. The third transistor T3 is turned on according to the scan signal Sn received through the scan line 151 to connect the gate electrode G1 and the second electrode D1 of the driving transistor T1, and also to connect the second electrode D1 of the driving transistor T1 and the second storage electrode E2 of the storage capacitor Cst.

The fourth transistor T4 serves to initialize the gate electrode G1 of the driving transistor T1 and the second storage electrode E2 of the storage capacitor Cst. The gate electrode G4 is connected to the previous scan line 152, and the first electrode S4 is connected to the initialization voltage line 127. The second electrode D4 of the fourth transistor T4 is connected to the second storage electrode E2 of the storage capacitor Cst and the gate electrode G1 of the driving transistor T1 via the second electrode D3 of the third transistor T3. The fourth transistor T4 transfers the initialization voltage Vint to the gate electrode G1 of the driving transistor T1 and the second storage electrode E2 of the storage capacitor Cst according to the previous scan signal Sn−1 received through the previous scan line 152. Accordingly, the gate voltage of the gate electrode G1 of the driving transistor T1 and the storage capacitor Cst are initialized. The initialization voltage Vint has a low voltage value, thereby being a voltage that turns on the driving transistor T1.

The fifth transistor T5 serves to transmit the driving voltage ELVDD to the driving transistor T1. The gate electrode G5 is connected to the light emission control line 153, and the first electrode S5 is connected to the driving voltage line 172. The second electrode D5 of the fifth transistor T5 is connected to the first electrode S1 of the driving transistor T1.

The sixth transistor T6 serves to transmit the driving current Id output from the driving transistor T1 to the light emitting diode (LED). The gate electrode G6 is connected to the light emission control line 153, and the first electrode S6 is connected to the second electrode D1 of the driving transistor T1. The second electrode D6 of the sixth transistor T6 is connected to the anode of the light emitting diode (LED).

If the fifth transistor T5 and the sixth transistor T6 are simultaneously turned on according to the light emission control signal EM transmitted through the light emission control line 153 and the driving voltage ELVDD is applied to the first electrode S1 of the driving transistor T1 through the fifth transistor T5, the driving transistor T1 outputs the driving current Id according to the voltage (i.e., the voltage of the second storage electrode E2 of the storage capacitor Cst) of the gate electrode G1 of the driving transistor T1. The output driving current Id is transmitted to the light emitting diode (LED) through the sixth transistor T6. As the current (Iled) flows through the light emitting diode (LED), the light emitting diode (LED) emits light.

The seventh transistor T7 serves to initialize the anode of the light emitting diode (LED). The gate electrode G7 is connected to the bypass control line 158, the first electrode S7 is connected to the anode of the light emitting diode (LED), and the second electrode D7 is connected to the initialization voltage line 127. The bypass control line 158 may be connected to the previous scan line 152, and the bypass signal GB is applied at the same timing signal as the previous scan signal Sn−1. The bypass control line 158 may transmit a signal separate from the previous scan signal Sn−1 without being connected with the previous scan line 152. When the seventh transistor T7 is turned on according to the bypass signal GB, the initialization voltage Vint is applied to the anode of the light emitting diode (LED) and initialized.

The first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. As a result, the second storage electrode E2 determines the voltage of the gate electrode G1 of the driving transistor T1, and receives the data voltage Dm through the second electrode D3 of the third transistor T3 or the initialization voltage Vint through the second electrode D4 of the fourth transistor T4.

On the other hand, the anode of the light emitting diode (LED) is connected to the second electrode D6 of the sixth transistor T6 and the first electrode S7 of the seventh transistor T7, and the cathode is connected to the common voltage line 741 transmitting the common voltage ELVSS.

In the embodiment of FIG. 20, the pixel circuit includes seven transistors (T1 to T7) and one capacitor Cst. The number of transistors, the number of capacitors, and their connections may be configured according to embodiments.

Figure 21:
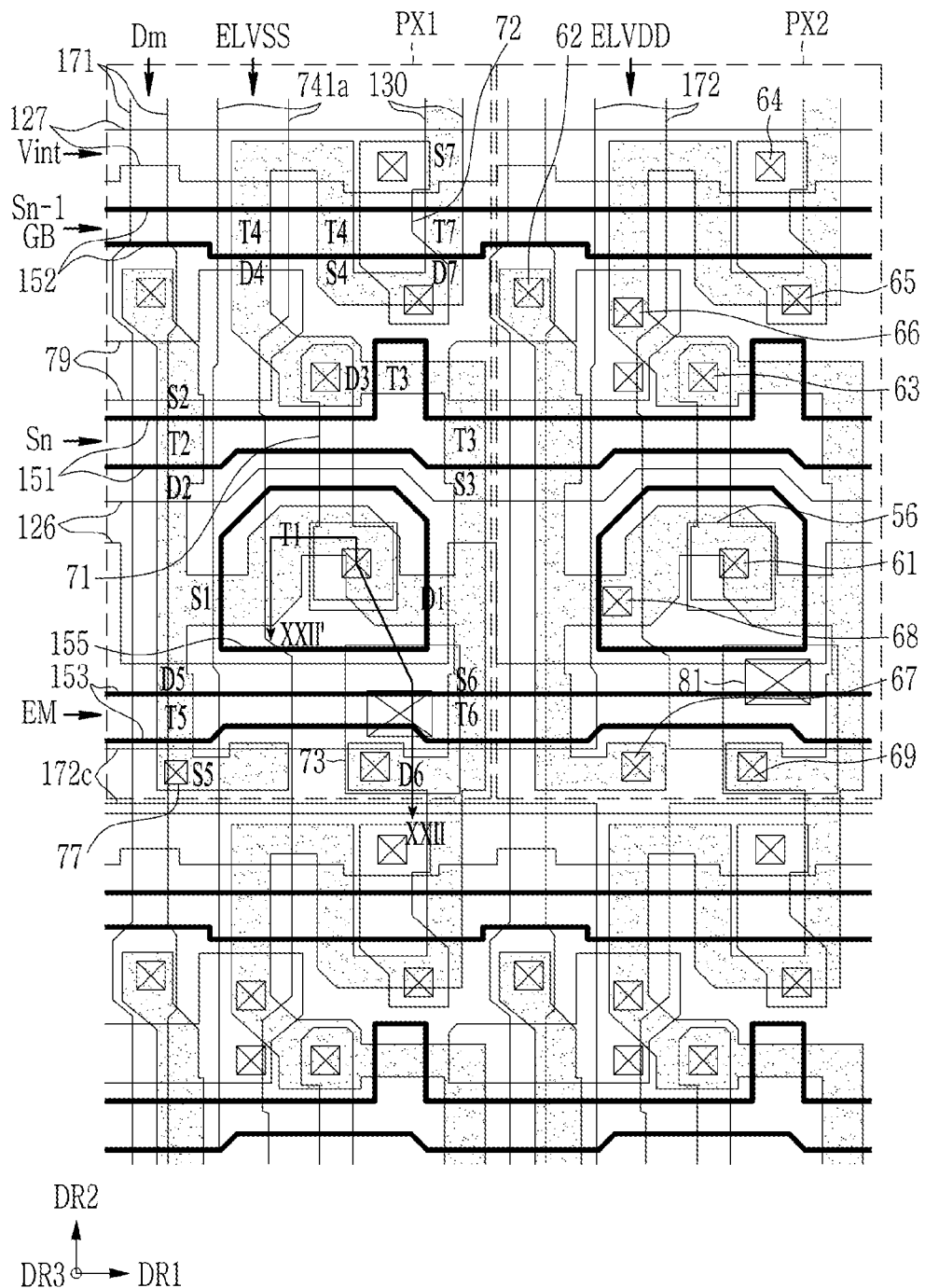
FIG. 21 is a layout view of one pixel area of an organic light emitting device according to an embodiment.
Figure 22:
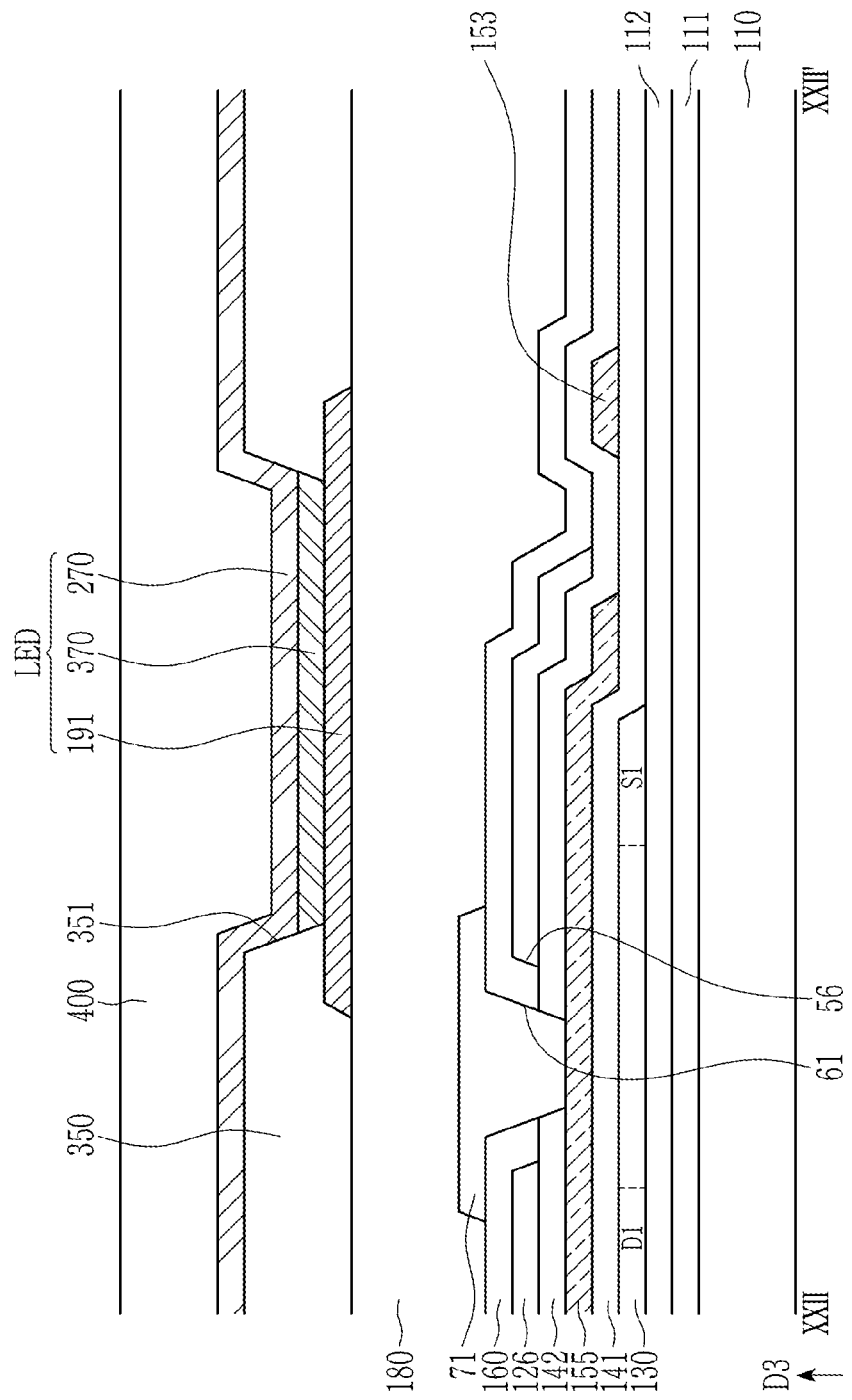
FIG. 22 is a cross-sectional view taken along a line XXII-XXII' in FIG. 21 according to an embodiment.

FIG. 21 is a layout view of one pixel area of an organic light emitting device according to an embodiment, and FIG. 22 is a cross-sectional view taken along a line XXII-XXII' in FIG. 21 according to an embodiment.

Referring to FIG. 21, the emissive display device includes a scan line 151 extending along the first direction D1 and transmitting the scan signal Sn, a previous scan line 152 transmitting the previous scan signal Sn−1, a light emission control line 153 transmitting the light emission control signal EM, and an initialization voltage line 127 transmitting the initialization voltage Vint. The bypass signal GB is transmitted through the previous scan line 152.

The emissive display device includes the data line 171 extending in a second direction DR2 crossing the first direction DR1 and transmitting the data voltage Dm, and the first common voltage line 741a transmitting the common voltage ELVSS. The first pixel PX1 described in FIG. 21 and FIG. 22 is the pixel PX1 in which the driving voltage line 172 is replaced with the first common voltage line 741a. The first pixel PX1 of FIG. 21 and FIG. 22 is an embodiment in which the driving voltage line 172 connected to the pixel is replaced with the first common voltage line 741a. In the second pixel PX2 shown in FIG. 21, the driving voltage line 172 is not replaced with the first common voltage line 741a, and the existing driving voltage line 172 is disposed. Hereinafter, the first pixel PX1 is described in comparison with the second pixel PX2.

The emissive display device incudes the driving transistor T1, the second transistor T2, the third transistor T3, the fourth transistor T4, the fifth transistor T5, the sixth transistor T6, the seventh transistor T7, the storage capacitor Cst, and the light emitting diode (LED).

Each channel of the driving transistor T1, the second transistor T2, the third transistor T3, the fourth transistor T4, the fifth transistor T5, the sixth transistor T6, and the seventh transistor T7 is disposed within a semiconductor layer 130 that is elongated. Also, at least part of the first electrode and the second electrode of the plurality of transistors T1, T2, T3, T4, T5, T6, and T7 is disposed in the semiconductor layer 130. The semiconductor layer 130 (a part in which the shade is added in FIG. 21) may be formed to be bent in various shapes. The semiconductor layer 130 may include a polycrystalline semiconductor such as polysilicon, or an oxide semiconductor.

The semiconductor layer 130 includes a channel channel-doped with an n-type impurity or a p-type impurity, and a first doping region and a second doping region of which a doping concentration is higher than the impurity doped with the channel. The first doping region and the second doping region correspond to the first electrode and the second electrode of the plurality of transistors T1, T2, T3, T4, T5, T6, and T7, respectively. One of the first doping region and the second doping region may be the source region, and the other may be the drain region. Also, in the semiconductor layer 130, a region between the first electrode and the second electrode of different transistors from each other may be doped such that two transistors may be electrically connected to each other.

Each channel of the plurality of transistors T1, T2, T3, T4, T5, T6, and T7 overlaps the gate electrode of each transistor T1, T2, T3, T4, T5, T6, and T7 and is disposed between the first electrode and the second electrode of each transistor T1, T2, T3, T4, T5, T6, and T7. A plurality of transistors T1, T2, T3, T4, T5, T6, and T7 may have substantially the same stacked structure. Hereinafter, the driving transistor T1 is mainly described in detail, and the remaining transistors T2, T3, T4, T5, T6, and T7 are briefly described.

The driving transistor T1 includes a channel, a first gate electrode 155, a first electrode S1, and a second electrode DE The channel of the driving transistor T1 is between the first electrode S1 and the second electrode D1, and overlaps the first gate electrode 155 in a plan view. The channel is curved to form a longer length of the channel in a limited region. As the length of the channel increases, a driving range of the gate voltage Vg applied to the first gate electrode 155 of the driving transistor T1 becomes wider, and the driving current Id constantly increases according to the gate voltage Vg. As a result, the gray of the light emitted from the light emitting diode (LED) may be controlled more precisely by changing the magnitude of the gate voltage Vg, and the display quality of the emissive display device may be improved. In addition, since the channel is not extended in one direction but extends in various directions, there is a merit in which the directional influence is canceled in the manufacturing process, thereby reducing the effect of process dispersion. Therefore, it is possible to prevent the deterioration of image quality such as an unevenness defect (e.g., a luminance difference is generated depending on the pixel even if the same data voltage Dm is applied) which may be caused by a characteristic difference of the driving transistor T1 depending on the region of display device due to the process dispersion. The shape of such a channel may be varied without being limited to the shown Ω type.

The first gate electrode 155 overlaps the channel on a plane. The first electrode S1 and the second electrode D1 are located on respective sides of the channel. An extended portion of a storage line 126 is insulated from and disposed above the first gate electrode 155. The extended portion of the storage line 126 overlaps the gate electrode 155 via the second gate insulating layer interposed therebetween on a plane, thereby configuring a storage capacitor Cst. The extended portion of the storage line 126 is the first storage electrode (E1 of FIG. 20) of the storage capacitor Cst, and the first gate electrode 155 is the second storage electrode (E2 of FIG. 20). The extended portion of the storage line 126 has an opening 56 so that the first gate electrode 155 is connected to a first data connecting member 71. Within the opening 56, the upper surface of the first gate electrode 155 and the first data connecting member 71 are electrically connected through a contact hole 61. The first data connecting member 71 is connected to the second electrode D3 of the third transistor T3 to connect the gate electrode 155 of the driving transistor T1 and the second electrode D3 of the third transistor T3.

The gate electrode of the second transistor T2 may be the part of the scan line 151. The data line 171 is in contact with the first electrode S2 of the second transistor T2 through a contact hole 62. The first electrode S2 and the second electrode D2 may be disposed on the semiconductor layer 130.

The third transistor T3 may be composed of two transistors adjacent to each other. Within the pixel PX of FIG. 21, two parts of T3 are on the left side and the lower side with respect to the portion where the semiconductor layer 130 is bent. These two parts play the role of the third transistor T3, respectively, and have a structure in which the first electrode S3 of one part of the third transistor T3 is connected to the second electrode D3 of the other part of the third transistor T3. The gate electrodes of two transistors T3 may be the part of the scan line 151 or the part protruded upward from the scan line 151. Such a structure may be referred to as a dual gate structure, and may serve to block a leakage current. The first electrode S3 of the third transistor T3 is connected to the first electrode S6 of the sixth transistor T6 and the second electrode D1 of the driving transistor T1. The second electrode D3 of the third transistor T3 is connected to the first data connecting member 71 through a contact hole 63.

The fourth transistor T4 is composed of two fourth transistors T4, and two fourth transistors T4 are formed at the intersection of the previous scan line 152 and the semiconductor layer 130. The gate electrode of the fourth transistor T4 may be the part of the previous scan line 152.

The first electrode S4 of one part of the fourth transistor T4 is connected to the second electrode D4 of the other part of the fourth transistor T4. Such a structure may be referred to as a dual gate structure, and may serve to block the leakage current. A second data connecting member 72 is connected to the first electrode S4 of the fourth transistor T4 through a contact hole 65, and the first data connecting member 71 is connected to the second electrode D4 of the fourth transistor T4 through the contact hole 63.

As such, by using the dual gate structure as the third transistor T3 and the fourth transistor T4, the leakage current may be effectively prevented by blocking an electron moving path of the channel in the off state.

The gate electrode of the fifth transistor T5 may be a part of the light emission control line 153. The driving voltage connection line 172c is connected to the first electrode S5 of the fifth transistor T5 through a contact hole 77, and the second electrode D5 is connected to the first electrode S1 of the driving transistor T1 through the semiconductor layer 130.

The first pixel PX1 receives the driving voltage ELVDD from the adjacent pixel PX2 through the driving voltage connection line 172c connected to the driving voltage line 172 of the adjacent pixel PX2 since the driving voltage line 172 connected to the pixel is replaced with the first common voltage line 741a.

However, in the second pixel PX2, the driving voltage line 172 is connected to the first electrode S5 of the fifth transistor T5 through a contact hole 67, and the second electrode D5 is connected to the first electrode S1 of the driving transistor T1 through the semiconductor layer 130.

The gate electrode of the sixth transistor T6 may be a part of the light emission control line 153. A third data connecting member 73 is connected to the second electrode D6 of the sixth transistor T6 through a contact hole 69, and the first electrode S6 is connected to the second electrode D1 of the driving transistor through the semiconductor layer 130.

The gate electrode of the seventh transistor T7 may be the part of the previous scan line 152. The first electrode S7 of the seventh transistor T7 is connected to the second electrode D6 of the sixth transistor T6, and the second electrode D7 is connected to the first electrode S4 of the fourth transistor T4.

The storage capacitor Cst includes the first storage electrode E1 and the second storage electrode E2 overlapping a second gate insulating layer 142 interposed therebetween. The second storage electrode E2 may correspond to the gate electrode 155 of the driving transistor T1, and the first storage electrode E1 may be the extended portion of the storage line 126. The second gate insulating layer 142 becomes a dielectric material, and the capacitance is determined by the charge stored in the storage capacitor Cst and the voltage between the first and second storage electrodes E1 and E2. By using the first gate electrode 155 as the second storage electrode E2, it is possible to secure a space for forming the storage capacitor Cst in the space narrowed by the channel of the driving transistor T1 that occupies a large area in the pixel.

The first storage electrode E1 of the first pixel PX1 receives the driving voltage through the driving voltage connection line 172c. Accordingly, the storage capacitor Cst stores the charge corresponding to the difference between the driving voltage ELVDD transmitted to the first storage electrode E1 through the driving voltage connection line 172c and the gate voltage Vg of the gate electrode 155.

However, the driving voltage line 172 is connected to the first storage electrode E1 of the second pixel PX2 through a contact hole 68. Therefore, the storage capacitor Cst stores the charge corresponding to the difference between the driving voltage ELVDD transmitted to the first storage electrode E1 through the driving voltage line 172 and the gate voltage Vg of the gate electrode 155.

The second data connecting member 72 is connected to the initialization voltage line 127 through a contact hole 64. The first electrode is connected to the third data connecting member 73 through a contact hole 81. The first electrode may be a pixel electrode.

A parasitic capacitor control pattern 79 may be disposed between the dual gate electrodes of the compensation transistor T3. There is a parasitic capacitor in the pixel. If the voltage applied to the parasitic capacitor changes, the image quality characteristic may change. In the first pixel PX1 of FIG. 21, the first common voltage line 741a is disposed instead of the driving voltage line 172 such that the driving voltage line 172 and the parasitic capacitor control pattern 79 are not connected, however in the second pixel PX2, the parasitic capacitor control pattern 79 is connected to the driving voltage line 172 through a contact hole 66. Thus, by applying the driving voltage ELVDD having a constant DC voltage to the parasitic capacitor, it is possible to prevent the image quality characteristic from being changed. The parasitic capacitor control pattern 79 may be disposed in a different region than that shown, and a voltage other than the driving voltage ELVDD may be applied.

One end of the first data connecting member 71 is connected to the gate electrode 155 through the contact hole 61, and the other end is connected to the second electrode D3 of the third transistor T3 and the second electrode D4 of the fourth transistor T4 through the contact hole 63.

One end of the second data connecting member 72 is connected to the first electrode S4 of the fourth transistor T4 through the contact hole 65, and the other end is connected to the initialization voltage line 127 through the contact hole 64.

The third data connecting member 73 is connected to second electrode of the sixth transistor T6 through the connect contact hole 69.

The cross-sectional structure of the emissive display device according to an embodiment is described with reference to FIG. 22 as well as FIG. 21.

The emissive display device includes a first substrate 110.

The first substrate 110 may include a plastic layer and a barrier layer. The plastic layer and the barrier layer may be alternately stacked.

The plastic layer may include one selected from a group including polyether sulfone (PES), polyacrylate (PAR), polyether imide (PEI), polyethylene naphthalate (PEN), polyethylene terephthalate (PET), polyphenylene sulfide (PPS), polyarylate, polyimide (PI), polycarbonate (PC), poly (arylene ether sulfone), and a combinations of some of the materials.

The barrier layer may include at least one of a silicon oxide, a silicon nitride, and aluminum oxide, and may include any inorganic material without being limited thereto.

A buffer layer 112 is disposed on the first substrate 110. The buffer layer 112 may include an inorganic insulating material such as a silicon oxide, a silicon nitride, aluminum oxide, or an organic insulating material such as polyimide acryl.

The semiconductor layer 130 including the channels and the first electrode and the second electrode of the plurality of transistors T1, T2, T3, T4, T5, T6, and T7 is disposed on the buffer layer 112.

A first gate insulating layer 141 covering the semiconductor layer 130 is disposed thereon. A first gate conductor including the first gate electrode 155, the scan line 151, the previous scan line 152, and the light emission control line 153 is disposed on the first gate insulating layer 141.

The second gate insulating layer 142 covering the first gate conductor is disposed thereon. The first gate insulating layer 141 and the second gate insulating layer 142 may include the inorganic insulating material such as a silicon nitride, a silicon oxide, and aluminum oxide, or the organic insulating material.

A second gate conductor including a storage line 126, an initialization voltage line 127, and a parasitic capacitor control pattern 79 is disposed on the second gate insulating layer 142.

An interlayer insulating layer 160 covering the second gate conductor is disposed on the second gate conductor. The interlayer insulating layer 160 may include the inorganic insulating material such as a silicon nitride, a silicon oxide, and aluminum oxide, or may include the organic insulating material.

A data conductor including the data line 171, the driving voltage line 172, the driving voltage connection line 172c, the first data connecting member 71, the second data connecting member 72, and the third data connecting member 73 is disposed on the interlayer insulating layer 160. The first data connecting member 71 may be connected to the first gate electrode 155 through the contact hole 61.

A passivation layer 180 covering the data conductor is disposed thereon. The passivation layer 180 may be a planarization layer, and may include the organic insulating material or the inorganic insulating material.

A first electrode 191 is disposed on the passivation layer 180. The first electrode 191 is connected to the third data connecting member 73 through the contact hole 81 formed in the passivation layer 180.

A partition 350 is formed on the passivation layer 180 and the first electrode 191. The partition 350 has an opening 351 overlapping the first electrode 191. An emission layer 370 is disposed on the opening 351. A second electrode 270 is disposed on the emission layer 370 and the partition 350. The first electrode 191, the emission layer 370, and the second electrode 270 form the light-emitting element (LED). The first electrode 191 may be a pixel electrode, and the second electrode 270 may be a common electrode.

According to an embodiment, the pixel electrode may be an anode which is a hole injection electrode, and the common electrode may be a cathode which is an electron injection electrode. In contrast, the pixel electrode may be the cathode and the common electrode may be the anode. When holes and electrons are injected into the emission layer from the pixel electrode and the common electrode, respectively, an exciton of which the injected holes and electrons are combined emits light when it falls from an excited state to a ground state.

An encapsulation layer 400 protecting the light-emitting element LED is disposed on the second electrode 270. The encapsulation layer 400 may be in contact with the second electrode 270 as shown, or may be spaced apart from the second electrode 270 according to an embodiment.

The encapsulation layer 400 may be a thin film encapsulation layer in which an inorganic film and an organic film are stacked, and may include a triple layer composed of the inorganic film, the organic film, and the inorganic film. According to an embodiment, a capping layer and a functional layer may be located between the second electrode 270 and the encapsulation layer 400.

Figure 23:
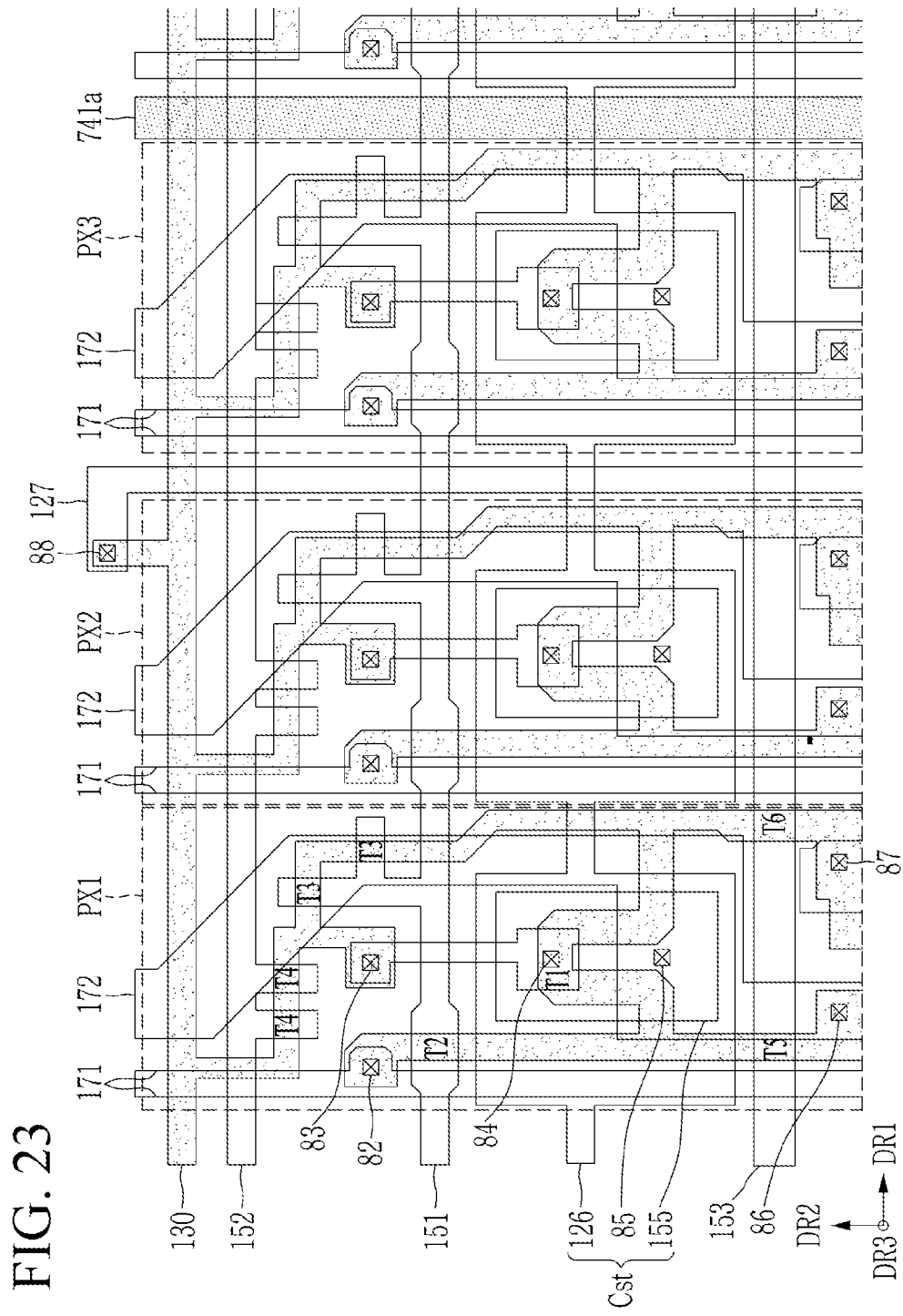
FIG. 23 is a layout view of a pixel area of a display device according to an embodiment.

FIG. 23 is a layout view of a pixel area of a display device according to an embodiment. Referring to FIG. 23, the display device includes a plurality of signal lines 127, 151, 152, 153, 171, 172, and 741. The plurality of signal lines may include the scan line 151, the previous scan line 152, and the light emission control line 153 disposed in the first direction DR1, and the data line 171, the driving voltage line 172, the initialization voltage line 127, and the common voltage line 741a disposed in the second direction DR2.

The display device includes the driving transistor T1, the second transistor T2, the third transistor T3, the fourth transistor T4, the fifth transistor T5, the sixth transistor T6, and the storage capacitor Cst.

Each channel of the driving transistor T1, the second transistor T2, the third transistor T3, the fourth transistor T4, the fifth transistor T5, and the sixth transistor T6 extends and is disposed within the semiconductor layer 130. At least part among the first electrodes and the second electrodes of the plurality of transistors T1, T2, T3, T4, T5, and T6 is disposed in the semiconductor layer 130.

Signal lines and the semiconductor layer are connected through a plurality of contact holes 82, 83, 84, 85, 86, 87, and 88.

Structures of transistors and signal lines may be similar to those shown in FIG. 21.

Referring to FIG. 23, the first common voltage line 741a is disposed outside the regions of the pixels PX1, PX2, and PX3. That is, in the display device of the embodiment of FIG. 21, the driving voltage line 172 of some pixels PX1 is replaced with the first common voltage line 741a, and the pixel PX1 receives the driving voltage from the neighboring pixel through the driving voltage connection line 172c.

A separate first common voltage line 741a is disposed outside the regions of the pixels PX1, PX2, and PX3. Therefore, the first common voltage line 741a may be disposed without removing the existing driving voltage line 172 of the pixels PX1, PX2, and PX3.

While example embodiments been described, practical embodiments are not limited to the disclosed embodiments. Practical embodiments cover various modifications and equivalent arrangements within the scope of the appended claims.

What is claimed is:

1. A display device comprising:
   a substrate including a display area and a non-display area;
   a first common voltage line at least partially disposed on the display area;
   an outer common voltage line disposed on the non-display area, electrically connected to the first common voltage line, and comprising:
   a first outer common sub-voltage line; and
   a second outer common sub-voltage line comprising a first-second outer common sub-voltage line and a second-second outer common sub-voltage line;
   a first outer common voltage line protruding from the second outer common sub-voltage line; and
   a second outer common voltage line protruding from the second outer common sub-voltage line,
   wherein the second outer common sub-voltage line is disposed between the first common voltage line and the first outer common voltage line.

2. The display device of claim 1, wherein a lengthwise direction of the second outer common voltage line is perpendicular to the width of the first outer common sub-voltage line.

3. The display device of claim 1, wherein a shortest electrical path between the first common voltage line and the first outer common voltage line is shorter than a shortest electrical path between the first common voltage line and the second outer common voltage line.

4. The display device of claim 1, further comprising pixels disposed on the display area, and
an outer initialization voltage line disposed between the outer common voltage line and the display area and electrically connected to at least some of the pixels.

5. The display device of claim 1, further comprising:
pixels disposed on the display area, a driving voltage line at least partially disposed on the display area; and
an outer driving voltage line disposed on the non-display area, disposed between the first-second outer common sub-voltage line and the second-second outer common sub-voltage line, electrically insulated from the outer common voltage line, and electrically connected to at least some of the pixels through the driving voltage line.

6. The display device of claim 5, wherein the second outer common sub-voltage line further comprises; a third-second outer common sub-voltage line; and a fourth-second outer common sub-voltage line, wherein the first-second outer common sub-voltage line is opposite the second-second outer common sub-voltage line in a first direction, wherein the first outer common sub-voltage line is opposite each of the third-second outer common sub-voltage line and the fourth-second outer common sub-voltage line in a second direction different from the first direction, and wherein the display area is disposed between the first outer common sub-voltage line and each of the third-second outer common sub-voltage line and the fourth-second outer common sub-voltage line in the second direction.

7. The display device of claim 6, wherein some of the pixels overlap the first common voltage line and do not overlap the driving voltage line.

8. The display device of claim 7, further comprising a second common voltage line electrically connected to the first common voltage line and crossing the first common voltage line.

9. The display device of claim 6, wherein the first common voltage line is disposed between a first subset of the pixels and a second subset of the pixels, and wherein a lengthwise direction of the first common voltage line is parallel to a lengthwise direction of the driving voltage line.

10. The display device of claim 9, further comprising a second common voltage line electrically connected to the first common voltage line and crossing the first common voltage line.

11. The display device of claim 5, wherein the second outer common sub-voltage line is opposite the first outer common sub-voltage line, and wherein two opposite sides of the display area are disposed between the first outer common sub-voltage line and the second outer common sub-voltage line.

12. The display device of claim 11, wherein some of the pixels overlap the first common voltage line and do not overlap the driving voltage line.

13. The display device of claim 12, further comprising a second common voltage line electrically connected to the first common voltage line and crossing the first common voltage line.

14. The display device of claim 11, wherein the first common voltage line is disposed between a first subset of the pixels and a second subset of the pixels, and wherein a lengthwise direction of the first common voltage line is parallel to a lengthwise direction of the driving voltage line.

15. The display device of claim 14, further comprising a second common voltage line electrically connected to the first common voltage line and crossing the first common voltage line.

16. A display device of comprising: a substrate including a display area and a non-display area; a first common voltage line at least partially disposed on the display area; an outer common voltage line disposed on the non-display area and electrically connected to the first common voltage line, and comprising: a first outer common sub-voltage line; and a second outer common sub-voltage line comprising: a first-second outer common sub-voltage line; a second-second outer common sub-voltage line; a third-second outer common sub-voltage line; and a fourth-second outer common sub-voltage line; wherein the first-second outer common sub-voltage line is spaced from the third-second outer common sub-voltage line in at least a first direction, wherein a voltage transmitted by the first-second outer common sub-voltage line is equal to a voltage transmitted by the third-second outer common sub-voltage line when the display device is in operation; a first outer common voltage line protruding from the third-second outer common sub-voltage line in a second direction and disposed on the non-display area, wherein the second direction is different from the first direction; and a second outer common voltage line protruding from the first-second outer common sub-voltage line and disposed on the non-display area.

17. The display device of claim 16, wherein each of a lengthwise direction of the first outer common voltage line, a lengthwise direction of the second outer common voltage line, and a lengthwise direction of the first common voltage line is perpendicular to the first direction.

18. The display device of claim 17, further comprising pixels disposed on the display area, and
an outer initialization voltage line electrically connected to at least some of the pixels.

19. The display device of claim 16, wherein a first side of the first-second outer common sub-voltage line is opposite a first side of the third-second outer common sub-voltage line in the first direction, and wherein a second side of the first-second outer common sub-voltage line is opposite a second side of the third-second outer common sub-voltage line in the second direction.

20. The display device of claim 16, further comprising a plurality of the first common voltage lines comprising the first common voltage line, wherein the total number of the first common voltage lines directly connected to the third-second outer common sub-voltage line is larger than the total number of the first common voltage lines directly connected to the first-second outer common sub-voltage line.

21. The display device of claim 16, further comprising:
pixels disposed on the display area;
a driving voltage line at least partially disposed on the display area; and
an outer driving voltage line disposed on the non-display area, disposed between the third-second outer common sub-voltage line and the fourth-second outer common sub-voltage line, electrically insulated from each of the third-second outer common sub-voltage line and the fourth-second outer common sub-voltage line, and electrically connected to at least some of the pixels through the driving voltage line.

22. The display device of claim 21, wherein the display area is disposed between the first outer common sub-voltage line and the second outer common sub-voltage line.

23. The display device of claim 22, wherein some of the pixels overlap the first common voltage line and do not overlap the driving voltage line.

24. The display device of claim 23, further comprising a second common voltage line electrically connected to the first common voltage line and crossing the first common voltage line.

25. The display device of claim 22, wherein the first common voltage line is disposed between a first subset of the pixels and a second subset of the pixels, and wherein a lengthwise direction of the first common voltage line is parallel to a lengthwise direction of the driving voltage line.

26. The display device of claim 25, further comprising a second common voltage line electrically connected to the first common voltage line and crossing the first common voltage line.

27. The display device of claim 16, wherein at least one edge of the third-second outer common sub-voltage line is parallel to one side of the display area and is disposed between an edge of the first-second outer common sub-voltage line and the one side of the display area in the second direction.

28. The display device of claim 27, further comprising pixels disposed on the display area, and
wherein some of the pixels overlap the first common voltage line and do not overlap a driving voltage line.

29. The display device of claim 28, further comprising a second common voltage line electrically connected to the first common voltage line and crossing the first common voltage line.

30. The display device of claim 27, wherein the first common voltage line is disposed between a first subset of the pixels and a second subset of the pixels, and wherein a lengthwise direction of the first common voltage line is parallel to a lengthwise direction of a driving voltage line.

31. The display device of claim 30, further comprising a second common voltage line electrically connected to the first common voltage line and crossing the first common voltage line.

* * * * *